US012713785B2

(12) United States Patent
Kim et al.

(10) Patent No.: US 12,713,785 B2
(45) Date of Patent: Aug. 18, 2026

(54) DISPLAY DEVICE

(71) Applicant: LG Display Co., Ltd., Seoul (KR)

(72) Inventors: MoonSoo Kim, Paju-si (KR); Dohong Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 679 days.

(21) Appl. No.: 18/054,505

(22) Filed: Nov. 10, 2022

(65) Prior Publication Data

US 2023/0172010 A1 Jun. 1, 2023

(30) Foreign Application Priority Data

Nov. 26, 2021 (KR) ........................ 10-2021-0166127

(51) Int. Cl.
*H10K 50/813* (2023.01)
*H10K 59/124* (2023.01)

(52) U.S. Cl.
CPC ......... *H10K 59/124* (2023.02); *H10K 50/813* (2023.02)

(58) Field of Classification Search
CPC ............... H10K 59/124; H10K 50/813; H10K 59/80515; H10K 71/861; H10K 71/831
See application file for complete search history.

(56) References Cited

U.S. PATENT DOCUMENTS

2002/0036471 A1* 3/2002 Silvestre .................. G09G 3/30 315/169.3
2020/0185573 A1* 6/2020 Shim ...................... H10K 59/38
2020/0212131 A1* 7/2020 Kim ...................... H10K 59/1315
2021/0193952 A1* 6/2021 Shim ................ H10K 59/80515
2022/0208883 A1* 6/2022 Kim ..................... H10K 59/353
2022/0399417 A1* 12/2022 Mou .................... H10K 59/131
2024/0251535 A1* 7/2024 Huang ................. H10K 59/131

FOREIGN PATENT DOCUMENTS

JP 2009244527 A * 10/2009
KR 20200080896 A 7/2020
KR 20210039160 A 4/2021
KR 20210082908 A 7/2021

* cited by examiner

*Primary Examiner* — Matthew C Landau
*Assistant Examiner* — David W Ward
(74) *Attorney, Agent, or Firm* — Seed Intellectual Property Law Group LLP

(57) ABSTRACT

A display device includes a substrate, a first driving transistor disposed over the substrate and included in a first subpixel, an overcoat layer over the first driving transistor, a first anode disposed over the first driving transistor and included in the first subpixel, a first emitting layer on the first anode, and a cathode on the first emitting layer. The first anode includes a first electrode part in a first area of the first subpixel, a second electrode part in a second area of the first subpixel different from the first area, and a first wire part connecting the first and second electrode parts. The overcoat layer includes a first trench in an area overlapping the first wire part. The first wire part includes a first bend disposed over the overcoat layer and bent along first and second inner side surfaces and a bottom surface of the first trench.

19 Claims, 24 Drawing Sheets

DISPLAY DEVICE

CROSS REFERENCE TO RELATED APPLICATION

This application claims priority from Korean Patent Application No. 10-2021-0166127, filed on Nov. 26, 2021, which is hereby incorporated by reference for all purposes as if fully set forth herein.

BACKGROUND

Technical Field

Embodiments of the present disclosure relate to a display device.

Description of Related Art

In fabrication of display panels, defects may occur due to a variety of reasons, for example, when an impurity is present in a variety of positions of a subpixel so that the subpixel forms a brightened point or a darkened point. For example, an impurity may be present between an anode and a cathode of an emitting device of each subpixel. In this case, the emitting device may not generate light, and thus the corresponding subpixel may become a darkened point.

BRIEF SUMMARY

In the field of display technology of the related art, when an anode-cathode short circuit is formed between an anode and a cathode of an emitting device by a process-induced impurity, a repair method of normalizing a corresponding subpixel by cutting a portion of the anode by irradiating the anode with a laser beam has been used. However, in such a repair method, separate laser irradiation equipment is required, and a laser beam must reach the anode electrode. Thus, there has been a problem in that the repair cannot be carried out in a situation in which a panel fabrication has been completed. In addition, there has been another problem in that, after shipment of a product and when a user has acquired a display device, the repair cannot be carried out. Therefore, the inventors of the present application have invented a repair method by which an anode can be self-cut without the irradiation of a laser beam, thereby normalizing a corresponding subpixel.

In embodiments of the present disclosure, provided is a display device having a structure by which a portion of an anode can be self-cut.

Also provided is a display device in which, during fabrication of a panel or after shipment of a product, a repair process of enabling a portion of an anode to be self-cut by reverse bias processing, thereby normalizing a corresponding subpixel, can be carried out.

According to embodiments, provided is a display device including: a substrate; a first driving transistor disposed over the substrate and included in a first subpixel; an overcoat layer over the first driving transistor; a first anode disposed over the first driving transistor and included in the first subpixel; a first emitting layer on the first anode; and a cathode on the first emitting layer.

The first anode may include a first electrode part disposed in a first area of the first subpixel, a second electrode part disposed in a second area of the first subpixel different from the first area, and a first wire part connecting the first electrode part and the second electrode part.

The overcoat layer may include a first trench in an area overlapping the first wire part. The first wire part may include a first bend disposed over the overcoat layer and bent along a first inner side surface, a bottom surface, and a second inner side surface of the first trench.

Also provided is a display device including: a first subpixel including a first driving transistor, a first anode, and a first emitting layer; a second subpixel including a second driving transistor, a second anode, and a second emitting layer; and an overcoat layer positioned between the first and second driving transistors and the first and second anodes, and including a first trench positioned in an area of the first anode and a second trench positioned in an area of the second anode.

The first anode may include a first electrode part disposed in a first area of the first subpixel, a second electrode part disposed in a second area of the first subpixel different from the first area, and a first wire part connecting the first electrode part and the second electrode part.

The second anode may include a third electrode part disposed in a third area of the second subpixel, a fourth electrode part disposed in a fourth area of the second subpixel different from the third area, and a second wire part connecting the third electrode part and the fourth electrode part.

When the first subpixel is a subpixel to which self-partial anode repair (SPARP) processing has been carried out and the second subpixel is a subpixel to which the SPARP processing has not been carried out, the first wire part may be disconnected inside the first trench of the overcoat layer, and the second wire part is not disconnected inside the second trench of the overcoat layer.

According to embodiments, the display device may have a structure by which a portion of an anode can be self-cut.

According to embodiments, in the display device, during fabrication of a panel or after shipment of a product, a repair process of enabling a portion of an anode to be self-cut by reverse bias processing, thereby normalizing a corresponding subpixel, can be carried out.

DESCRIPTION OF THE SEVERAL VIEWS OF THE DRAWINGS

The above and other benefits, features, and advantages of the present disclosure will be more clearly understood from the following detailed description, taken in conjunction with the accompanying drawings, in which.

DETAILED DESCRIPTION

Figure 1:
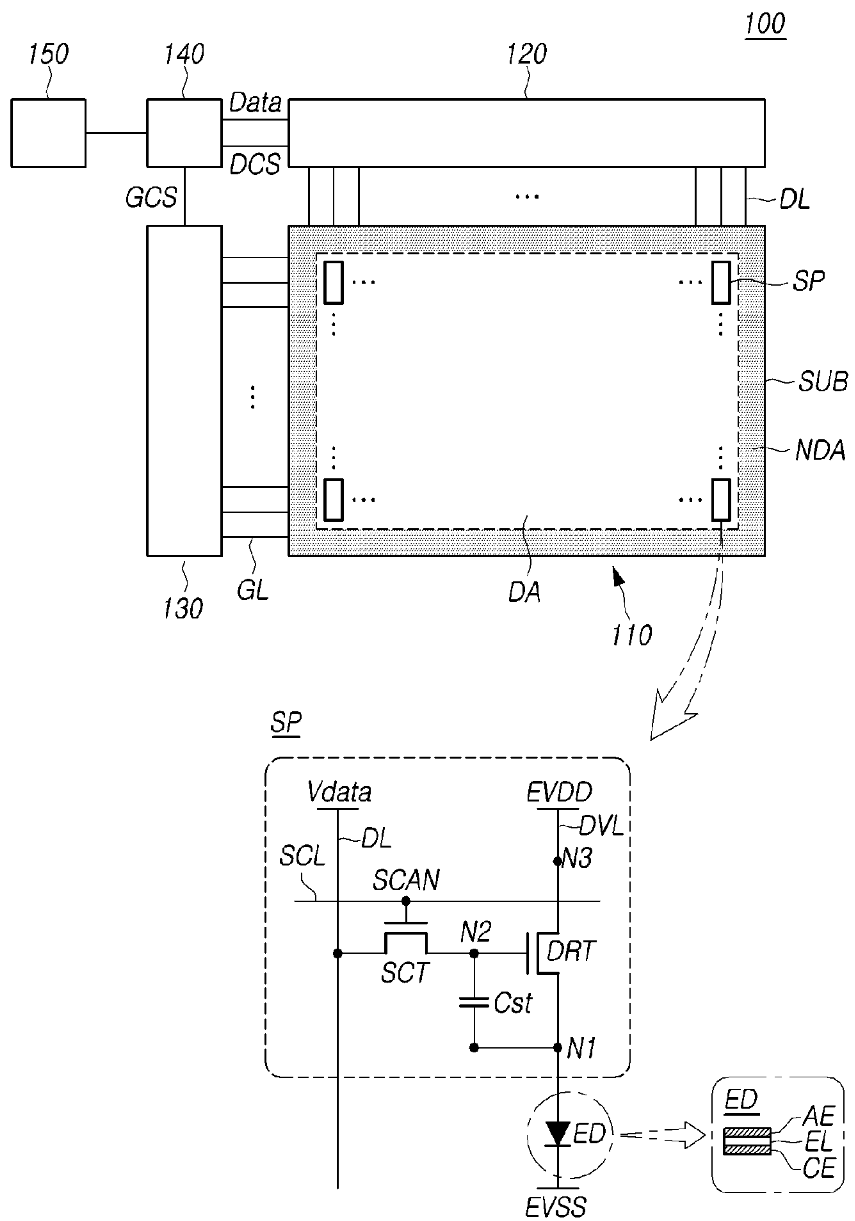
FIG. 1 is a diagram illustrating a system configuration of a display device according to embodiments.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including," "having," "containing," "constituting," "made up of," and "formed of" used herein are generally intended to allow other components to be added unless the terms are used with the term "only." As used herein, singular forms are intended to include plural forms unless the context clearly indicates otherwise.

Terms, such as "first," "second," "A," "B," "(A)," or "(B)" may be used herein to describe elements of the present disclosure. Each of these terms is not used to define essence, order, sequence, or number of elements, etc., but is used merely to distinguish the corresponding element from other elements.

When it is mentioned that a first element "is connected or coupled to," "contacts or overlaps," etc., a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc., each other via a fourth element. Here, the second element may be included in at least one of two or more elements that "are connected or coupled to," "contact or overlap," etc., each other. The term "over" is used herein in its broadest sense to include above, on, directly on, directly above, over and various combinations thereof, therefore the term "over" as used here of one structure relative to another structure is to be interpreted to include any one of those meanings or combinations thereof. Hereinafter, a variety of embodiments will be described in detail with reference to the accompanying drawings.

FIG. 1 is a diagram illustrating a system configuration of a display device 100 according to embodiments. Referring to FIG. 1, a display driving system of the display device 100 according to embodiments may include a display panel 110 and a display driver circuit driving the display panel 110.

The display panel 110 may include a display area DA on which images are displayed and a non-display area NDA on which images are not displayed. The display panel 110 may include a plurality of subpixels SP disposed over a substrate SUB in order to display images. The display panel 110 may include a plurality of signal lines disposed over the substrate SUB to drive the plurality of subpixels SP. For example, the plurality of signal lines may include data lines DL, gate lines GL, drive voltage lines, and the like.

Each of the plurality of data lines DL may be arranged to extend in a first direction (e.g., a column direction or a row direction). Each of the plurality of gate lines GL may be arranged to extend in a direction transverse (e.g., perpendicular to) the first direction.

The display driver circuit may include a data driver circuit 120 and a gate driver circuit 130, and also include a controller 140 to control the data driver circuit 120 and the gate driver circuit 130.

The data driver circuit 120 may output data signals (also referred to as data voltages) corresponding to image signals to the plurality of data lines DL. The gate driver circuit 130 may generate gate signals and output the gate signals to the plurality of gate lines GL. The controller 140 may convert image data input from an external host 150 into image data having a data signal format readable by the data driver circuit 120, and supply the image data to the data driver circuit 120.

The data driver circuit 120 may include one or more source driver integrated circuits (SDICs). For example, each of the SDICs may be connected to the display panel 110 by a tape-automated bonding (TAB) method, connected to a bonding pad of the display panel 110 by a chip-on-glass (COG) method or a chip-on-panel (COP) method, or implemented as a chip-on-film (COF) structure connected to the display panel 110.

The gate driver circuit 130 may be connected to the display panel 110 by a TAB method, connected to a bonding pad of the display panel 110 by a COG method or a COP method, connected to the display panel 110 by a COF method, or formed in the non-display area NDA of the display panel 110 by a gate-in-panel (GIP) method.

Referring to FIG. 1, in the display device 100 according to embodiments, each of the subpixels SP includes an emitting device ED and a pixel driver circuit SPC to drive the emitting device ED. The pixel driver circuit SPC may include a driving transistor DRT, a scan transistor SCT, and a storage capacitor Cst.

The driving transistor DRT may drive the emitting device ED by controlling a current flowing through the emitting device ED. The scan transistor SCT may transfer a data voltage Vdata to a second node N2, i.e., a gate node, of the driving transistor DRT. The storage capacitor Cst may be configured to maintain a voltage for a predetermined or selected time.

The emitting device ED may include an anode electrode AE, a cathode CE, and an emissive layer EL positioned between the anode electrode AE and the cathode CE. The anode AE may be a pixel electrode involved in the formation of the emitting device ED of each of the subpixels SP, and may be electrically connected to a first node N1 of the driving transistor DRT. The cathode CE may be a common electrode involved in the formation of the emitting device ED of each of the subpixels SP, and a base voltage EVSS may be applied to the cathode CE.

For example, the emitting device ED may be an organic light-emitting diode (OLED), a light-emitting diode (LED) based on an inorganic material, a quantum dot emitting device that is a self-emissive semiconductor crystal, or the like.

The driving transistor DRT may be a transistor to drive the emitting device ED, and may include the first node N1, the second node N2, and a third node N3. The first node N1 may be a source node or a drain node, and may be electrically connected to the anode AE of the emitting device ED. The second node N2 may be a gate node, and may be electrically connected to a source node or a drain node of the scan transistor SCT. The third node N3 may be a drain node or a source node, and may be electrically connected to a driving voltage line DVL through which a driving voltage EVDD is supplied. Hereinafter, for the sake of brevity, the first node N2 will be described as being a source node, whereas the third node N3 will be described as being a drain node.

The scan transistor SCT may switch the connection between a data line DL and the second node N2 of the driving transistor DRT. The scan transistor SCT may control the connection between the second node N2 of the driving transistor DRT and a corresponding data line DL among the plurality of data lines DL in response to a scan signal SCAN supplied through a scan line SCL, i.e., a type of gate line GL.

The storage capacitor Cst may be provided between the first node N1 and the second node N2 of the driving transistor DRT.

The structure of the subpixel SP illustrated in FIG. 1 is only an example given for explanation. Rather, the subpixel structure may further include one or more transistors or one or more capacitors. In addition, all of the plurality of subpixels may have the same structure, or some of the plurality of subpixels may have a different structure. Each of the driving transistor DRT and the scan transistor SCT may be an N-type transistor or a P-type transistor.

In addition, the display device 100 according to embodiments may have a top emission structure or a bottom emission structure. Hereinafter, as an example, the display device 100 will be described as having a top emission structure. For example, in the case of the top emission structure, the anode AE may be formed of a reflective metal, whereas the cathode CE may be formed of a transparent conductive film.

Figure 2:
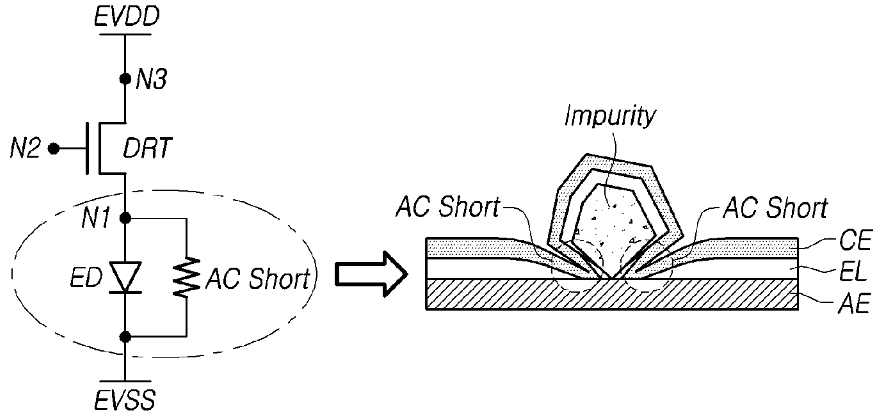
FIG. 2 illustrates a cathode-anode short circuit in a subpixel in which an impurity is present in the display device according to embodiments.

FIG. 2 illustrates a cathode-anode short circuit in a subpixel SP in which an impurity is present in the display device 100 according to embodiments. Referring to FIG. 2, during a panel fabrication process or after the panel fabrication process (e.g., after shipment of a product), an impurity may present in an area of a subpixel SP among the plurality of subpixels SP disposed in the display panel 110. When the impurity present in the area of the subpixel SP is positioned on the anode AE of the emitting device ED, the anode AE and the cathode CE may be electrically short-circuited by the impurity. This phenomenon will be referred to as a cathode-anode short circuit AC Short.

When a cathode-anode short circuit is formed, driving current supplied by the driving transistor DRT may flow directly from the anode AE electrically connected to the first node N1 of the driving transistor DRT to the cathode CE. Consequently, the emitting device ED in the subpixel SP in which the cathode-anode short circuit is formed may not generate light, and thus the corresponding subpixel SP may be darkened. The subpixel SP darkened by the cathode-anode short circuit having the impurity may also be referred to as a bad subpixel Bad SP.

Figure 3:
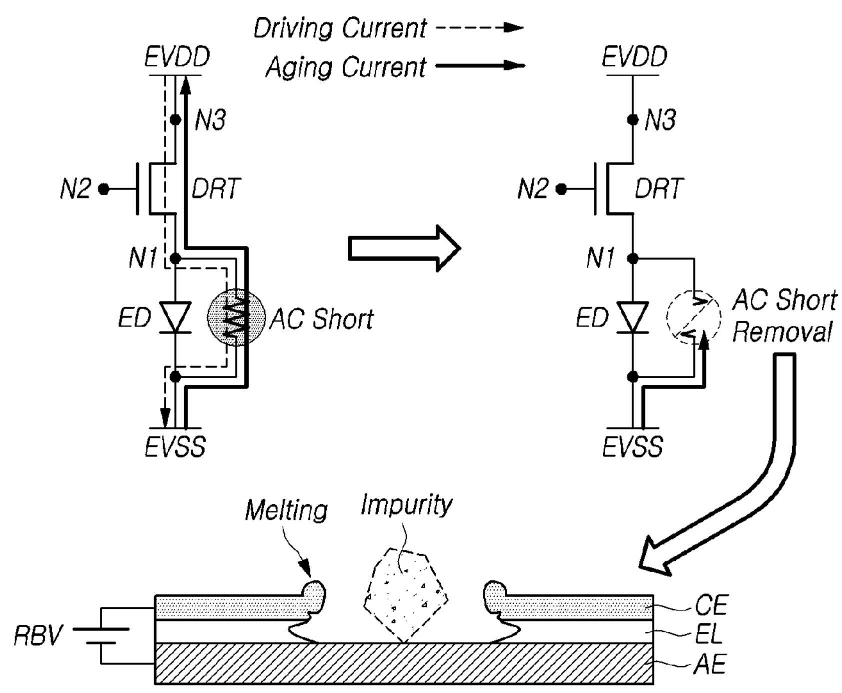
FIG. 3 illustrates an aging process for removing a cathode-anode short circuit in the display device according to embodiments.

FIG. 3 illustrates an aging process for removing a cathode-anode short circuit in the display device 100 according to embodiments.

Referring to FIG. 3, during a panel fabrication process or during a product repair process after shipment of the product, an aging process for removing a cathode-anode short circuit may be performed. The aging process is a type of repair method for the subpixels SP. The aging process may include reverse bias processing to apply a reverse bias voltage RBL between the cathode CE and the third node N3 of the driving transistor DRT.

The reverse bias processing may be performed by the display driver circuit including the data driver circuit 120, the gate driver circuit 130, the controller 140, a power management circuit, and the like. In the reverse bias processing, a turn-on level voltage may be supplied to the second node N2 of the driving transistor DRT in order to turn on the driving transistor DRT. Here, the turn-on level voltage may be a turn-on level data voltage Vdata supplied to the second node N2 of the driving transistor DRT through the scan transistor SCT. In the reverse bias processing, a driving voltage EVDD may be converted into a low level voltage, and the base voltage EVSS may be converted into a high level voltage.

In the reverse bias processing of the aging process, the cathode CE may have a higher voltage than the anode AE. When the reverse bias processing is performed, an aging current may flow from the cathode CE to the third node N3 of the driving transistor DRT. Here, the aging current may flow through the driving transistor DRT.

When the aging process is performed, heat may be generated in a portion in which the cathode-anode short circuit is formed. The generation of heat in the portion having the cathode-anode short circuit through the aging process may be referred to as Joule heating. Heat generated in the portion having the cathode-anode short circuit may melt the cathode CE and the impurity, thereby removing the cathode-anode short circuit.

Figure 4:
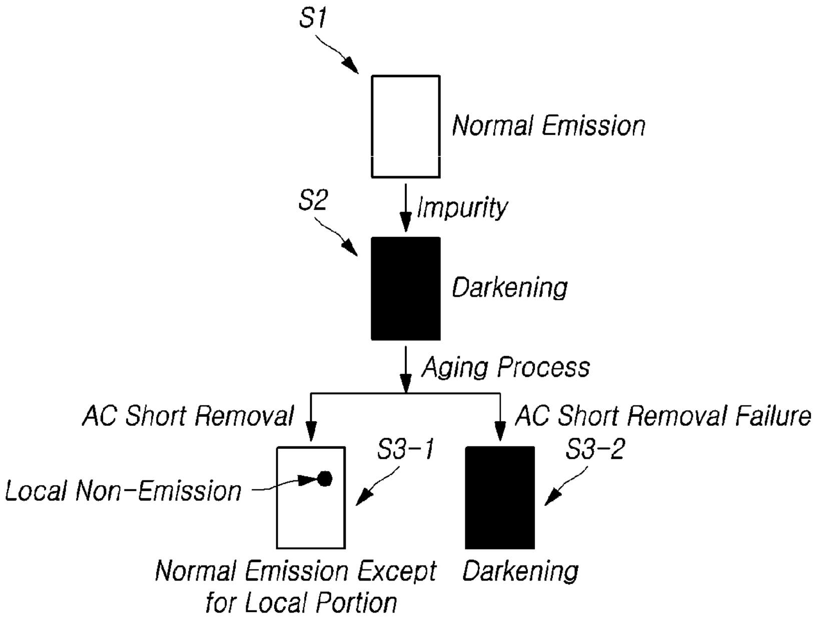
FIG. 4 illustrates emission states according to the subpixel type in the display device according to embodiments.

FIG. 4 illustrates emission states of a normal subpixel SP, a bad subpixel SP in which a cathode-anode short circuit AC Short is formed, a normalized subpixel SP from which a cathode-anode short circuit AC Short has been removed, and a bad subpixel SP from which a cathode-anode short circuit AC Short has not been removed.

When a cathode-anode short circuit is formed by an impurity in the area of a subpixel SP having a normal emission state (S1), the entire emission area of the subpixel SP may be darkened (S2). The darkened state (S2) of the subpixel SP may be recognized, and an aging process for the darkened subpixel SP may be performed.

When the cathode-anode short circuit is removed in the aging process, only a portion from which the cathode-anode short circuit is removed is in a non-emission state, and the overall emission state of the subpixel SP may be recognized as being generally normal (S3-1). When the cathode-anode short circuit is not removed in the aging process, the entire emission area of the subpixel SP may remain in the darkened state (S3-2).

As described above, in the case of the aging process, a situation in which the cathode-anode short circuit is not removed and the subpixel SP is not normalized may frequently occur. Therefore, embodiments of the present disclosure propose "self-partial anode repair (SPARP)" as a repair method having a higher probability to normalize a bad subpixel having an impurity.

The SPARP according to embodiments of the present disclosure is a repair process of cutting a portion of the anode AE of the subpixel SP having an impurity so that a portion of a subpixel SP is enabled to emit light using the remaining portion of the anode AE, thereby normalizing the subpixel SP.

In the SPARP processing according to embodiments, the partial cutting of the anode AE is a method of causing the anode AE to be self-cut in response to the application of a reverse bias voltage as in the aging process, rather than a method of cutting the anode AE by irradiating the anode AE with a laser beam or applying physical force to the anode AE.

In the SPARP processing according to embodiments, the anode AE may have a self-cutting enabled structure (also referred to as a trench structure) for the SPARP. In addition, an insulating layer below the anode AE may have a trench so that the self-cutting enabled structure (also referred to as the trench structure) can be formed. Here, the insulating layer having a trench may also be referred to as an overcoat layer.

When the SPARP according to embodiments is a repair method of normalizing a subpixel SP having an impurity by partially cutting the anode AE of the subpixel SP and lighting a half of the subpixel SP using a half of the anode AE, the SPARP may be referred to as self-half anode repair (SHARP). Hereinafter, for the sake of brevity, a structure for the SPARP and SPARP processing will be described in detail on the assumption that the SPARP is the SHARP.

The SPARP processing according to embodiments may be carried out during the panel fabrication process or during product repair processing after shipment of a product, or may be carried out while a repair menu function in user environment settings is being executed after the shipment of the product.

Figure 5:
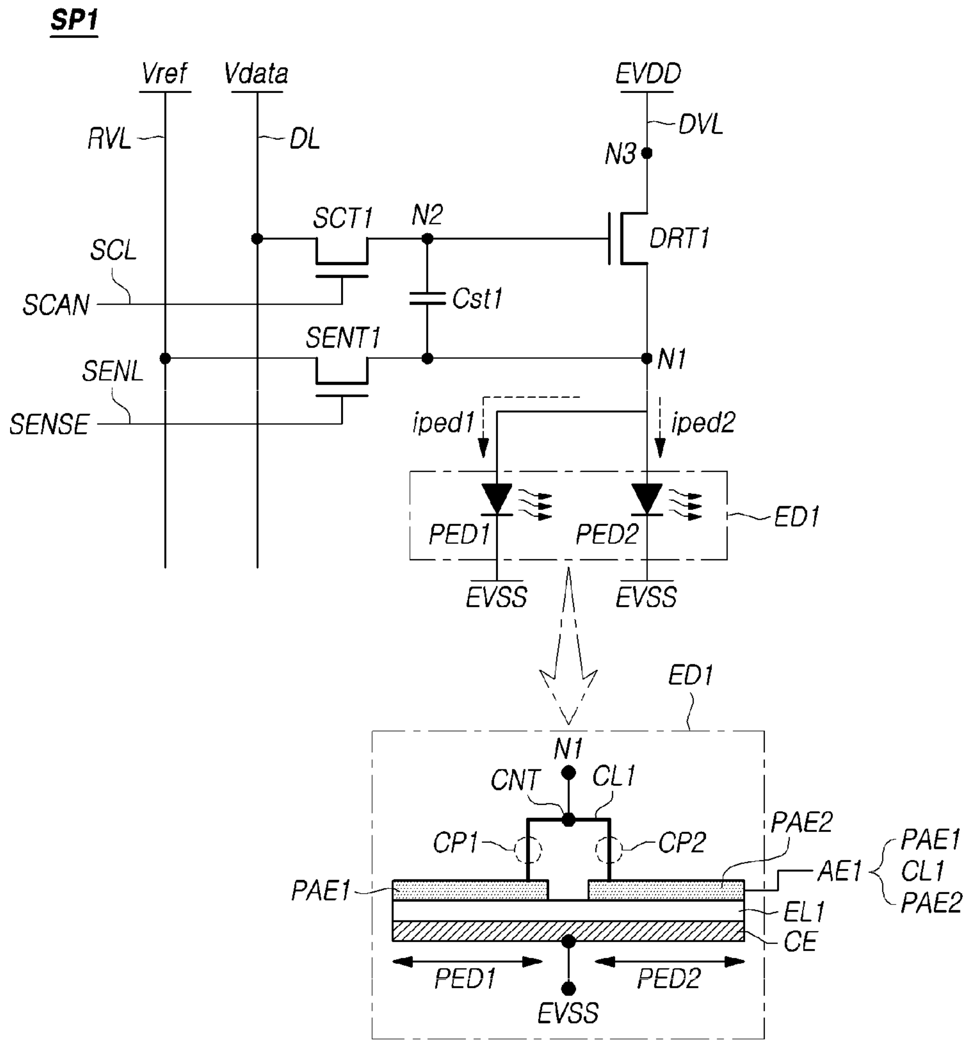
FIGS. 5 and 6 are equivalent circuits of first subpixels for conceptually describing the self-partial anode repair (SPARP) of the display device according to embodiments.
Figure 6:
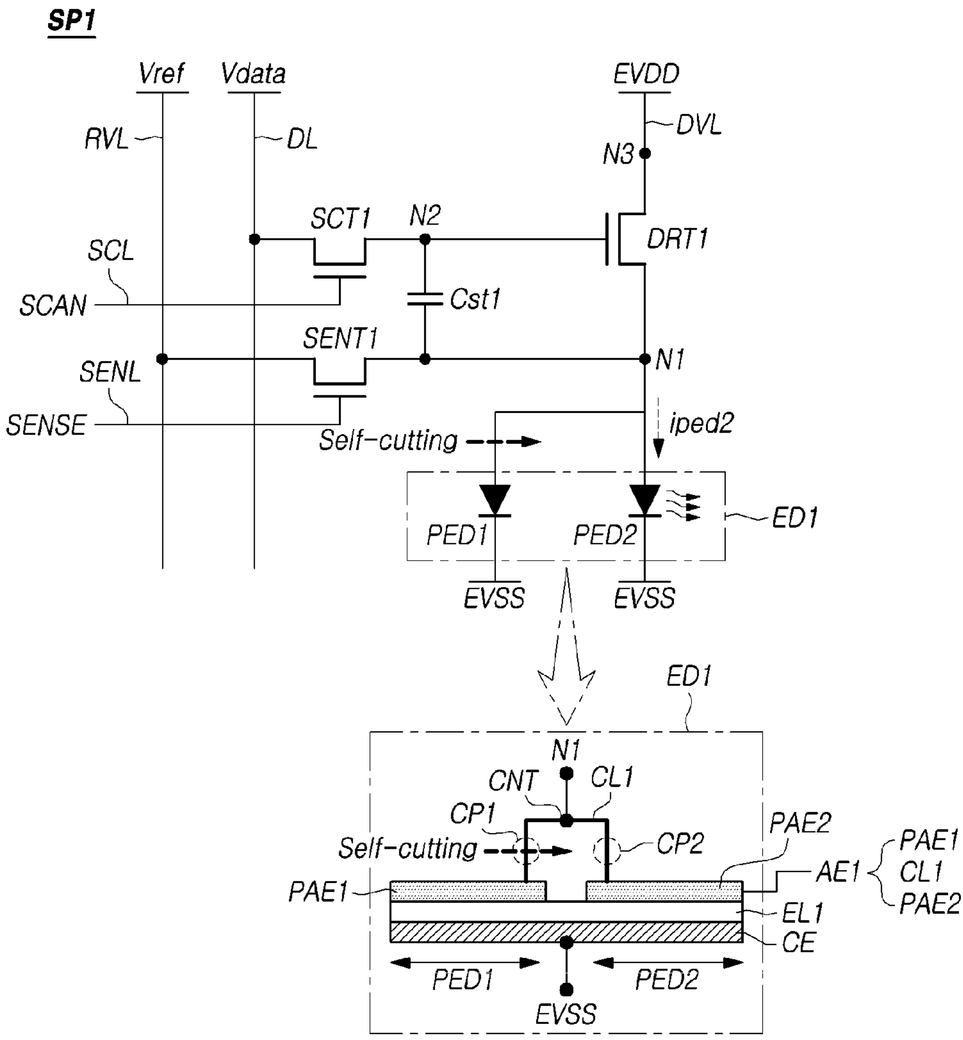

FIGS. 5 and 6 are equivalent circuits of first subpixels SP1 for conceptually describing the SPARP of the display device 100 according to embodiments. The equivalent circuit of the first subpixel SP illustrated in FIG. 5 is an equivalent circuit of a normal subpixel without a cathode-anode short circuit due to no impurities being present therein. The equivalent circuit of the first subpixel SP illustrated in FIG. 6 is an equivalent circuit of a subpixel from which a cathode-anode short circuit is removed by the SPARP processing according to embodiments.

Referring to FIG. 5, each of the subpixels SP in the display device 100 according to embodiments may include a first emitting device ED1, a first driving transistor DRT1, a first scan transistor SCT1, and a first storage capacitor Cst1. Each of the subpixels SP may further include a first sensing transistor SENT1 switching the connection between a first node N1 of the driving transistor DRT and a reference voltage line RVL. The first sensing transistor SENT1 may be controlled by a sensing signal SENSE so as to be turned on or off.

As illustrated in FIG. 5, a scan line SCL connected to a gate node of the first scan transistor SCT1 and a sensing line SENL of the first sensing transistor SENT1 may be different gate lines GL. Alternatively, the scan line SCL connected to the gate node of the first scan transistor SCT1 and the sensing line SENL of the first sensing transistor SENT1 may be may be the same gate line GL.

Referring to FIG. 5, for the SPARP according to embodiments, the first emitting device ED1 may include a first emitting device part PED1 and a second emitting device part PED2. The first emitting device part PED1 and the second emitting device part PED2 may be connected in parallel to the first node N1 of the first driving transistor DRT1 and the cathode CE.

Referring to FIG. 5, the first emitting device ED1 may include a first anode AE1, a first emitting layer EL1, and a cathode CE. For the SPARP according to embodiments, the first anode AE1 may include a first electrode part PAE1, a second electrode part PAE2, and a first wire (or conductive line) part CL1.

The first wire part CL1 may connect the first electrode part PAE1 and the second electrode part PAE2, and be electrically connected to the first node N1 of the first driving transistor DRT1 through a contact hole CNT.

The first emitting device part PED1 may include the first electrode part PAE1, the first emitting layer EL1, and the cathode CE, whereas the second emitting device part PED2 may include the second electrode part PAE2, the first emitting layer EL1, and the cathode CE.

Referring to FIG. 5, in response to current driving of the first driving transistor DRT1, a first partial driving current Iped1 may flow through the first emitting device part PED1, whereas a second partial driving current Iped2 may flow through the second emitting device part PED2. Thus, the light can be emitted from the entire emission-possible area corresponding to the first emitting device ED1.

When a cathode-anode short circuit is formed by an impurity in the area of the first subpixel SP1, the SPARP processing according to embodiments may be carried out. For example, it will be assumed that a short circuit is formed between the first electrode part PAE1 and the cathode CE as an impurity is present between the first electrode part PAE1, among the first electrode part PAE1 and the second electrode part PAE2, and the cathode CE.

For the SPARP processing according to embodiments, the first wire part CL1 may have predetermined or selected cutting points CP1 and CP2.

The predetermined or selected cutting points CP1 and CP2 in the first wire part CL1 may include one or more among the first cutting point CP1 between the contact hole CNT and the first electrode part PAE1 and the second cutting point CP2 between the contact hole CNT and the second electrode part PAE2. Hereinafter, for the sake of brevity, it will be assumed that both the first cutting point CP1 (i.e., a point at which a first trench TRC1 to be described later is formed) and the second cutting point CP2 (i.e., a point at which a second trench TRC2 to be described later is formed) are present. In the predetermined or selected cutting points CP1 and CP2, the first wire part CL1 may have a structure (i.e., a self-cutting enabled structure) that can be easily cut by the reverse bias processing.

Referring to FIG. 6, in the SPARP processing according to embodiments, the first wire part CL1 may be self-cut by the reverse bias processing at the first cutting point CP1 more adjacent to an impurity site PAE1 to CE (i.e., the position of a cathode-anode short circuit), among the first cutting point CP1 and the second cutting point CP2, due to characteristics of the self-cutting enabled structure.

Referring to FIG. 6, in the SPARP processing according to embodiments, in response to current driving of the first driving transistor DRT1, no current is supplied to the first emitting device part PED1, whereas the second partial driving current Iped2 may flow through the second emitting device part PED2. Thus, light can be emitted from an emission-possible area corresponding to the second emitting device part PED2, among the entire emission-possible area corresponding to the first emitting device ED1. That is, light can only be emitted from the half of the entire emission-possible area corresponding to the first emitting device ED1. However, since light can be emitted from a portion of the first subpixel SP, the first subpixel SP can be recognized as a normal subpixel.

Hereinafter, the self-cutting enabled structure of the first anode AE1 which can be easily cut by the reverse bias processing in the above-described SPARP processing according to embodiments will be described in more detail.

Figure 7:
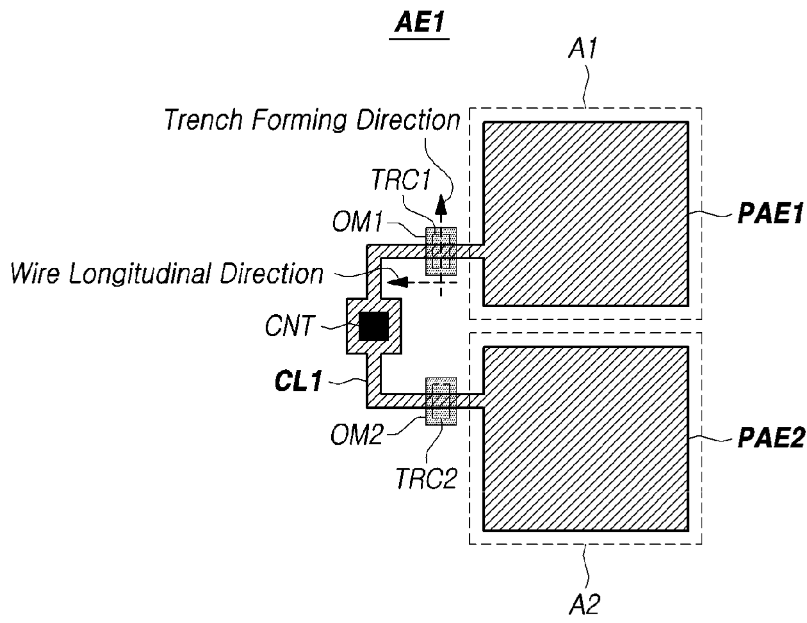
FIGS. 7 to 9 illustrate an example of the self-cutting enabled structure of the first anode for the SPARP of the display device according to embodiments.
Figure 8:
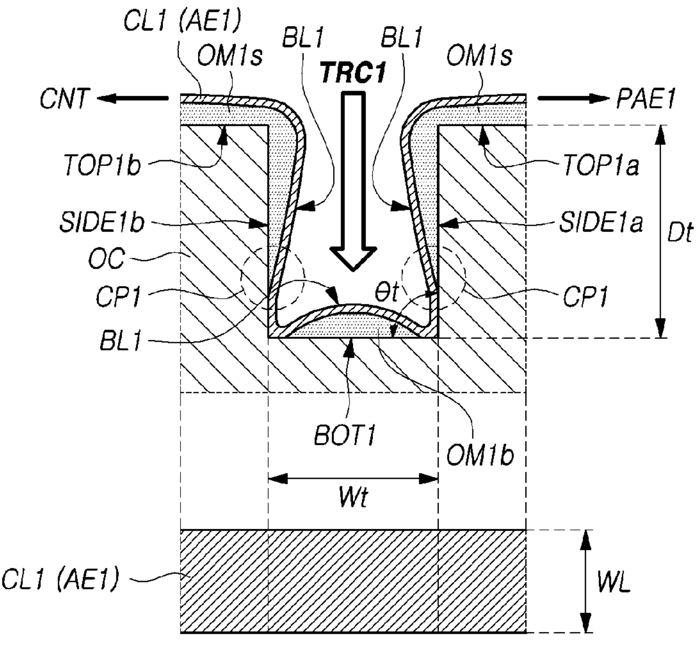
Figure 9:
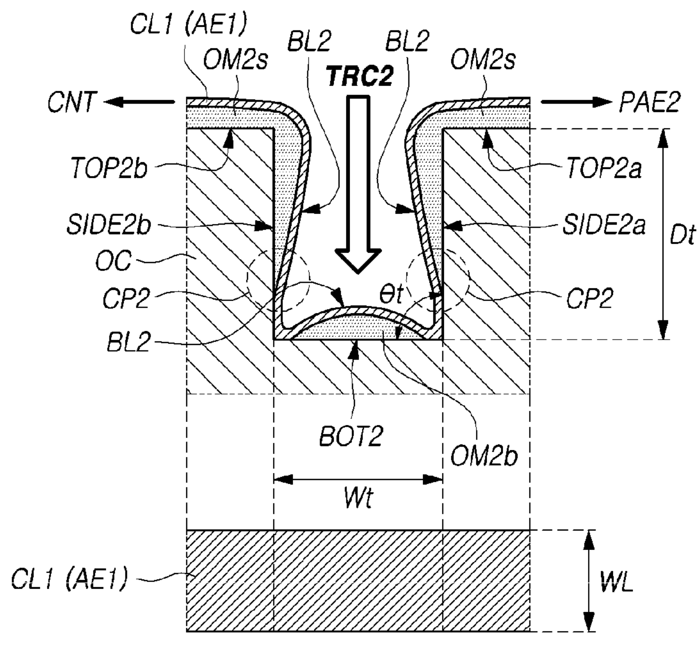
Figure 10:
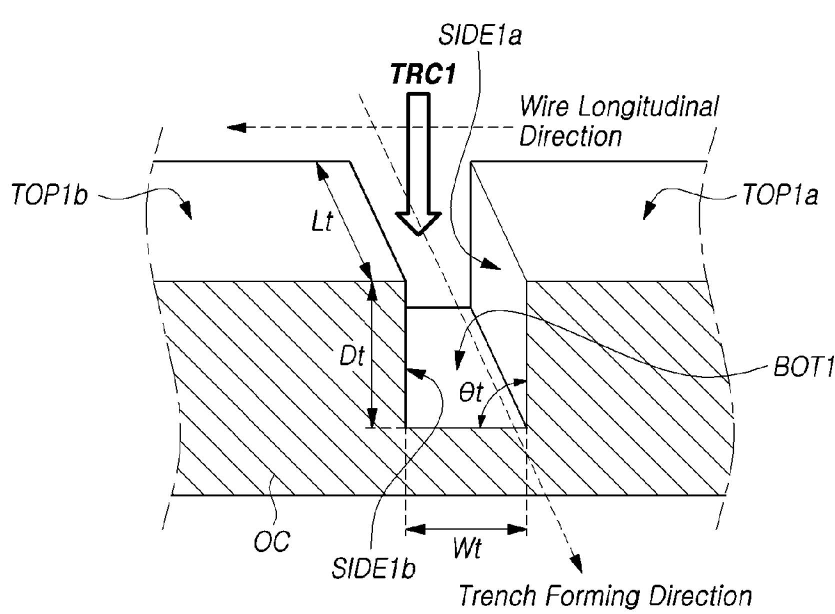
FIG. 10 illustrates an example of the first trench of the overcoat layer for the SPARP of the display device according to embodiments.

FIGS. 7 to 9 illustrate an example of the self-cutting enabled structure of the first anode AE1 for the SPARP of the display device 100 according to embodiments, and FIG. 10 illustrates an example of the first trench TRC1 of the overcoat layer OC for the SPARP of the display device 100 according to embodiments.

Referring to FIGS. 7 to 10, for the SPARP according to embodiments, the first anode AE1 may have a self-cutting enabled structure (also referred to as a trench structure or an SPARP structure). Here, the first anode AE1 taken as an example may be included in the first subpixel SP, and be a pixel electrode of the first emitting device ED1 in a first subpixel SP.

The first subpixel SP may include the first driving transistor DRT1 disposed over a substrate SUB. The overcoat layer OC, a type of insulating layer, may be disposed over the first driving transistor DRT1.

The first anode AE1 may be disposed over the first driving transistor DRT1, and be electrically connected to the first node N1 of the first driving transistor DRT1 through the contact hole CNT in the overcoat layer OC. The first emitting layer EL1 may be disposed on the first anode AE1. The cathode CE may be disposed on the first emitting layer EL1.

Referring to FIGS. 7 to 10, the first anode AE1 may include the first electrode part PAE1, the second electrode part PAE2, and the first wire part CL1. The first electrode part PAE1 may be disposed in a first area A1 of the first subpixel SP. The second electrode part PAE2 may be disposed in a second area A2 of the first subpixel SP different from the first area A1. The first wire part CL1 may connect the first electrode part PAE1 and the second electrode part PAE2.

The first emitting layer EL1 may be disposed on all of the first electrode part PAE1, the second electrode part PAE2, and the first wire part CL1, or only be disposed on the first electrode part PAE1 and the second electrode part PAE2.

In the first emitting layer EL1, a portion positioned on the first electrode part PAE1 and a portion positioned on the second electrode part PAE2 may be integrated. Alternatively, the first emitting layer EL1 may be divided into a portion positioned on the first electrode part PAE1 and a portion positioned on the second electrode part PAE2.

Referring to FIGS. 7 and 8, the overcoat layer OC may include the first trench TRC1 in an area in which the overcoat layer OC overlaps the first wire part CL1. Here, the position of the first trench TRC1 may match the position of the first cutting point CP1 among the predetermined or selected cutting points CP1 and CP2 in the first wire part CL1.

The first wire part CL1 may include a first bend BL1 disposed over the overcoat layer OC, and bent along a first inner side surface SIDE1*a*, a bottom surface BOT1, and a second inner side surface SIDE1*b* of the first trench TRC1.

The first wire part CL1 may be electrically connected to the first node N1 of the first driving transistor DRT1 through the contact hole CNT (see FIG. 24) in the overcoat layer OC.

Referring to FIGS. 7 and 9, the overcoat layer OC may further include the second trench TRC2 in an area in which the overcoat layer OC overlaps the first wire part CL1. Here, the position of the second trench TRC2 may match the position of the second cutting point CP2 among the predetermined or selected cutting points CP1 and CP2 in the first wire part CL1.

The first wire part CL1 may further include a second bend BL2 disposed over the overcoat layer OC, and bent along a first inner side surface SIDE2*a*, a bottom surface BOT2, and a second inner side surface SIDE2*b* of the second trench TRC2.

The first trench TRC1 may be positioned between the contact hole CNT and the first electrode part PAE1, whereas the second trench TRC2 may be positioned between the contact hole CNT and the second electrode part PAE2.

The first trench TRC1 may have a structure by which the first bend BL1 of the first wire part CL1 can be self-cut when a cathode-anode short circuit is formed by an impurity present between the first electrode part PAE1 and the cathode CE. The second trench TRC2 may have a structure by which the second bend BL2 of the first wire part CL1 can be self-cut when a cathode-anode short circuit is formed by an impurity present between the second electrode part PAE2 and the cathode CE.

Referring to FIGS. 7 and 10, the first trench TRC1 of the overcoat layer OC may be formed in a direction transverse (e.g., perpendicular to) the longitudinal direction of the first wire part CL1. Likewise, the second trench TRC2 of the overcoat layer OC may extend in a direction transverse (e.g., perpendicular to) the longitudinal direction of the first wire part CL1.

Referring to FIGS. 7 and 8, a first organic material OM1 may be disposed inside the first trench TRC1 and around the first trench TRC1. The first wire part CL1 may be disposed on the first organic material OM1.

The first organic material OM1 may include a first side organic material OM1*s* positioned on the first inner side surface SIDE1*a* and second inner side surface SIDE1*b* of the first trench TRC1. The first side organic material OM1*s* may extend to outer portions TOP1*a* and TOP1*b* of the first trench TRC1. That is, the first side organic material OM1*s* may extend to the outer portions TOP1*a* and TOP1*b* of the first trench TRC1 to be disposed on the outer portions TOP1*a* and TOP1*b* of the first trench TRC1. The first organic material OM1 may further include a first bottom organic material OM1*b* positioned on the bottom surface BOT1 of the first trench TRC1.

Referring to FIGS. 7 and 8, the first cutting point CP1 may be a point between the first side organic material OM1*s* and the first bottom organic material OM1*b*. In the SPARP processing according to embodiments, when the reverse bias processing is carried out, the first wire part CL1 of first anode AE1 may be easily disconnected (e.g., broken) at the first cutting point CP1 between the first side organic material OM1*s* and the first bottom organic material OM1*b*.

As described above, since the first side organic material OM1*s* and the first bottom organic material OM1*b* are disposed on the inner side surfaces SIDE1*a* and SIDE1*b* and the bottom surface BOT1 of the first trench TRC1 formed in the overcoat layer OC and the first side organic material OM1*s* and the first bottom organic material OM1*b* are bent, the first wire part CL1 of first anode AE1 may be disposed so as to be easily disconnectable at the first cutting point CP1 between the first side organic material OM1*s* and the first bottom organic material OM1*b* when the reverse bias processing is carried out in the SPARP processing according to embodiments.

Referring to FIGS. 7 and 9, a second organic material OM2 may be disposed inside the second trench TRC2 and around the second trench TRC2. The first wire part CL1 may be disposed on the second organic material OM2. The second organic material OM2 may include a second side organic material OM2*s* positioned on the first inner side surface SIDE2*a* and the second inner side surface SIDE2*b* of the second trench TRC2. The second side organic material OM2*s* may be disposed to extend to outer portions TOP2*a* and TOP2*b* of the second trench TRC2. That is, the second side organic material OM2*s* may extend to the outer portions TOP2*a* and TOP2*b* of the second trench TRC2 and be disposed on the outer portions TOP2*a* and TOP2*b* of the second trench TRC2. The second organic material OM2 may further include a second bottom organic material OM2*b* positioned on the bottom surface BOT2 of the second trench TRC2.

Referring to FIGS. 7 and 9, the second cutting point CP2 may be a point between the second side organic material OM2*s* and the second bottom organic material OM2*b*. In the SPARP processing according to embodiments, when the reverse bias processing is carried out, the first wire part CL1 of first anode AE1 may be easily disconnected at the second cutting point CP2 between the second side organic material OM2*s* and the second bottom organic material OM2*b*. As described above, since the second side organic material OM2*s* and second bottom organic material OM2*b* are disposed on the inner side surfaces SIDE2*a* and SIDE2*b* and the bottom surface BOT2 of the second trench TRC2 formed in the overcoat layer OC and the second side organic material OM2*s* and the second bottom organic material OM2*b* are bent, the first wire part CL1 of first anode AE1 may be disposed so as to be easily disconnectable at the second cutting point CP2 between the second side organic material OM2*s* and the second bottom organic material OM2*b* when the reverse bias processing is carried out in the SPARP processing according to embodiments.

The state of the first anode AE1 may vary depending on the presence or absence of the SPARP processing according to embodiments or the type of the first subpixel SP (e.g., a normal subpixel without an impurity or a subpixel normalized by the SPARP processing).

When the first subpixel SP is a normal subpixel, that is, when the first subpixel SP is a subpixel to which the SPARP processing has not been carried out, all of the first electrode part PAE1, the second electrode part PAE2, and the first wire part CL1 may be supposed to be electrically connected.

When the first subpixel SP is a subpixel normalized from a bad subpixel having a cathode-anode short circuit caused by an impurity, that is, the first subpixel SP is a subpixel normalized from the bad subpixel through the SPARP processing, only one of the first electrode part PAE1 and the second electrode part PAE2 may be supposed to be electrically connected to the first wire part CL1.

In the SPARP processing according to embodiments, how easily the first wire part CL1 of first anode AE1 having a cathode-anode short circuit will be disconnected may vary depending on the trench structure (e.g., a width Wt, a depth Dt, or an inner side surface inclination θt) of the overcoat layer OC or the width WL of the first wire part CL1.

Referring to FIGS. 8 and 10, the first trench TRC1 of the overcoat layer OC is a type of groove, and is a path through which the first wire part CL1 of first anode AE1 extends. The first wire part CL1 of first anode AE1 may extend through the first trench TRC1 of the overcoat layer OC. The first wire part CL1 of first anode AE1 may be disposed along the first inner side surface SIDE1*a*, the bottom surface BOT1, and the second inner side surface SIDE1*b* of the first trench TRC1.

Referring to FIGS. 8 and 10, the depth Dt of the first trench TRC1 may be the height from the outer portions TOP1*a* and TOP1*b* of the first trench TRC1 to the bottom surface BOT1 of the first trench TRC1. The width Wt of the first trench TRC1 may be the distance between the first inner side surface SIDE1*a* and the second inner side surface SIDE1*b*. The width Wt of the first trench TRC1 may be determined on the basis of the bottom surface BOT1. The inner side surface inclination θt of the first trench TRC1 may be an angle between the first inner side surface SIDE1*a* or the second inner side surface SIDE1*b* and the bottom surface BOT1.

Referring to FIGS. 7 to 10, the first trench TRC1 and the second trench TRC2 through which the first wire part CL1 extents may have the same structure (e.g., the same width Wt, depth Dt, or inner side surface inclination θt).

Referring to FIGS. 7 to 10, the first wire part CL1 of first anode AE1 may have a predetermined or selected width WL. The width WL of the first wire part CL1 may correspond to the length Lt of the first trench TRC1. The length Lt of the first trench TRC1 may be equal to the width WL of the first wire part CL1, greater than the width WL of the first wire part CL1, or smaller than the width WL of the first wire part CL1.

Figure 11:
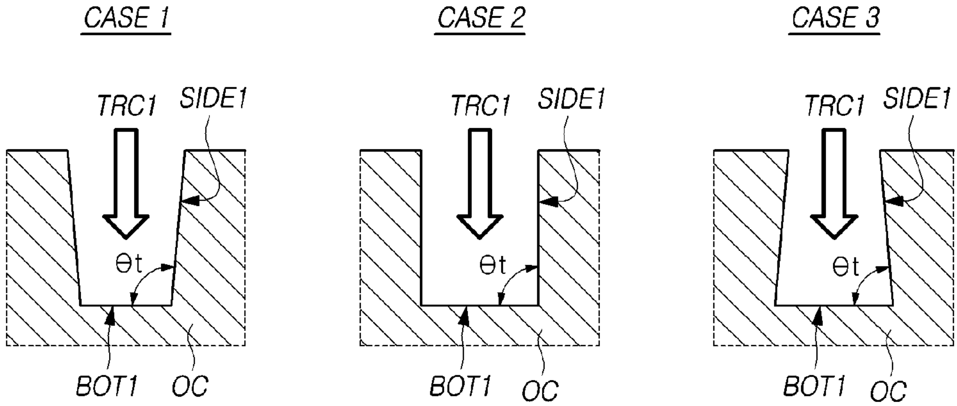
FIG. 11 illustrates examples of inner side surface inclination structures of the first trench of the overcoat layer for the SPARP of the display device according to embodiments.

FIG. 11 illustrates examples of inner side surface inclination structures of the first trench TRC1 of the overcoat layer OC for the SPARP of the display device 100 according to embodiments.

The inner side surface inclination θt of the first trench TRC1 is an angle between the inner side surface SIDE1 of the first trench TRC1 and the bottom surface BOT1 of the first trench TRC1. Here, the inner side surface SIDE1 of the first trench TRC1 may be the first inner side surface SIDE1*a* or the second inner side surface SIDE1*b*.

As in CASE 1, the inner side surface inclination θt of the first trench TRC1 may be in the range greater than 90° and smaller than 180°. As in CASE 2, the inner side surface inclination θt of the first trench TRC1 may be 90° (vertical). As in CASE 3, the inner side surface inclination θt of the first trench TRC1 may be in the range greater than 0° and smaller than 90°. The inner side surface inclination structure of CASE 1 may be referred to as a tapered structure, whereas the inner side surface inclination structure of CASE 3 may be referred to as an inverted tapered structure.

The self-cutting enabled structure of the first anode AE1 refers to a structure refers to a structure by which the first wire part CL1 of first anode AE1 can be easily disconnected inside the first trench TRC1.

As the self-cutting enabled structure of the first anode AE1, the inverted tapered structure of CASE 3 may be most suitable, and the vertical structure of CASE 2 may be the next suitable. Thus, for the self-cutting enabled structure of the first anode AE1, the angle between the first inner side surface SIDE1*a* or the second inner side surface SIDE1*b* of the first trench TRC1 and the bottom surface BOT1 of the first trench TRC1 may be equal to or smaller than 90° (CASE 2 and CASE 3).

Figure 12:
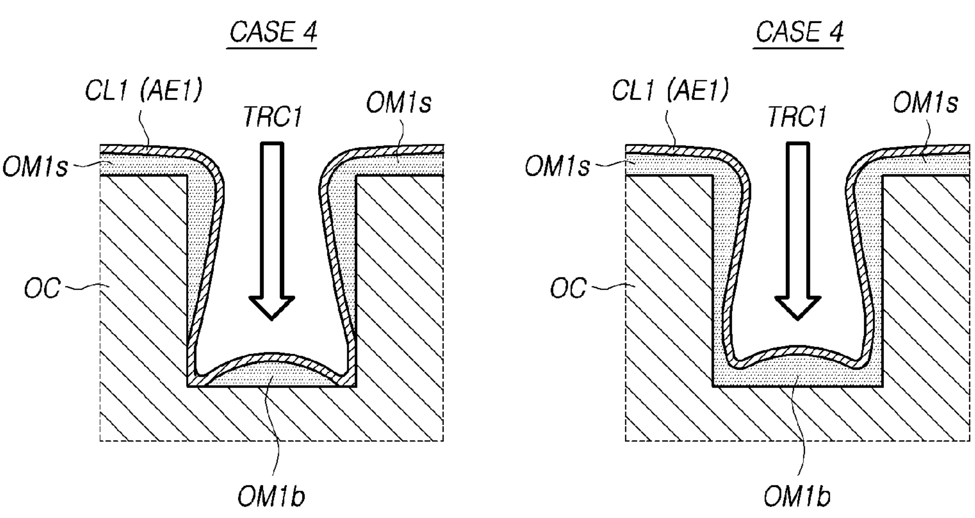
FIG. 12 illustrates examples of organic material deposition structures in the first trench of the overcoat layer for the SPARP of the display device according to embodiments.

FIG. 12 illustrates examples of organic material deposition structures in the first trench TRC1 of the overcoat layer OC for the SPARP of the display device 100 according to embodiments.

For the self-cutting enabled structure of the first anode AE1, the first organic material OM1 may be deposited inside and around the first trench TRC1.

The first organic material OM1 may include the first side organic material OM1*s* positioned on the first inner side surface SIDE1*a* and the second inner side surface SIDE1*b* of the first trench TRC1 and the first bottom organic material OM1*b* positioned on the bottom surface BOT1 of the first trench TRC1. The first side organic material OM1*s* may extend to the outer portions TOP1*a* and TOP1*b* of the first trench TRC1 to be disposed on the outer portions TOP1*a* and TOP1*b* of the first trench TRC1.

As in CASE 4, the first side organic material OM1*s* and the first bottom organic material OM1*b* may be separated from each other. Alternatively, the first side organic material OM1*s* and the first bottom organic material OM1*b* may be connected to each other.

Figure 13:
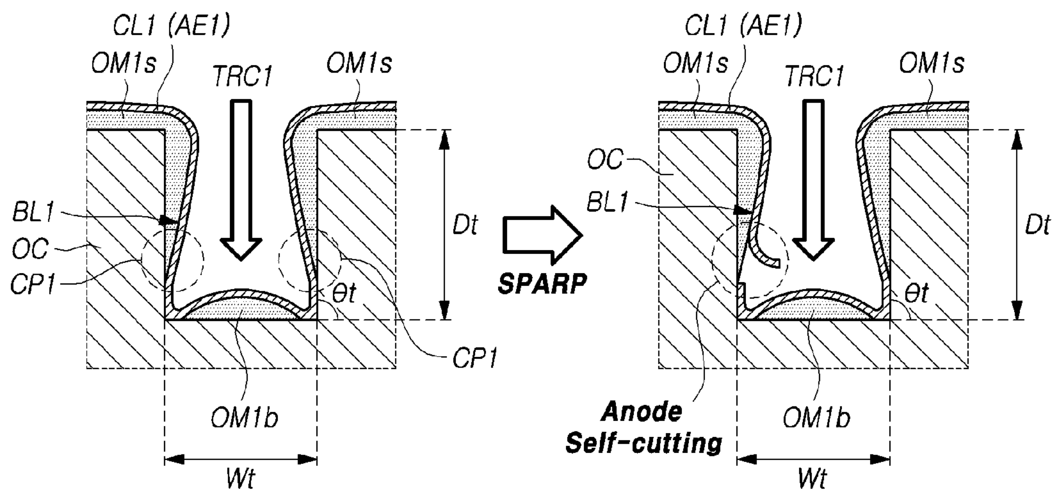
FIG. 13 illustrates an example of the first anode self-cut by the SPARP processing for the first subpixel in the display device according to embodiments.

FIG. 13 illustrates an example of the first anode AE1 self-cut by the SPARP processing for the first subpixel SP in the display device 100 according to embodiments.

In the area of the first subpixel SP, in a situation in which a cathode-anode short circuit is formed by an impurity present between the first electrode part PAE1 of the first anode AE1 and the cathode CE, when the SPARP processing according to embodiments is carried out for the first subpixel SP, the reverse bias processing (see FIG. 3) may be carried out.

When the reverse bias processing is carried out, the first wire part CL1 may be self-cut inside the first trench TRC1 due to characteristics of the self-cutting enabled structure (i.e., the trench structure). Particularly, the first wire part CL1 may be self-cut inside the first trench TRC1 more adjacent to a position at which the cathode-anode short circuit is formed, among the first trench TRC1 and the second trench TRC2.

Here, the two predetermined or selected cutting points CP1 and CP2 in the first wire part CL1 may include the first cutting point CP1 between the contact hole CNT and the first electrode part PAE1 and the second cutting point CP2 between the contact hole CNT and the second electrode part PAE2. The first cutting point CP1 may be at the position at which the first trench TRC1 is formed, and the second cutting point CP2 may be at the position at which the second trench TRC2 is formed.

Figure 14:
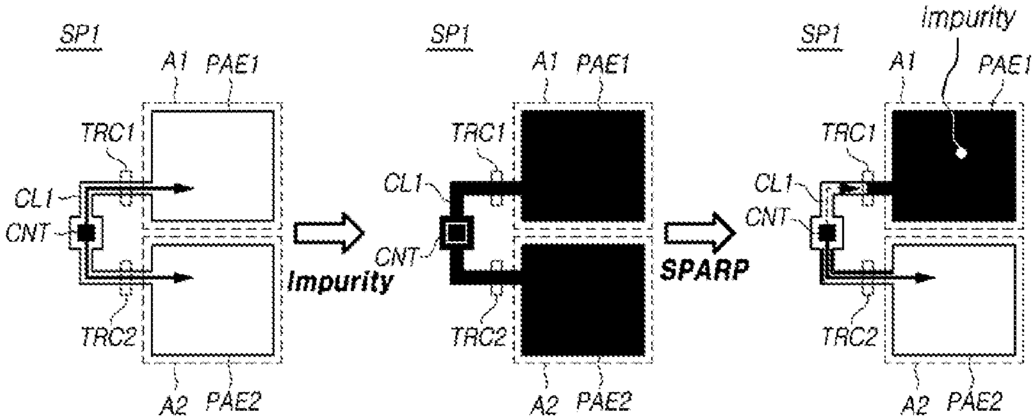
FIG. 14 illustrates changes in the emission state of the first subpixel before and after the SPARP processing for the first subpixel.

FIG. 14 illustrates changes in the emission state of the first subpixel SP before and after the SPARP processing for the first subpixel SP.

The state of the first anode AE1 may vary depending on the presence or absence of the SPARP processing according to embodiments or the type of the first subpixel SP (e.g., a normal subpixel without an impurity or a subpixel normalized by the SPARP processing).

When the first subpixel SP is a normal subpixel, that is, when the first subpixel SP is a subpixel to which the SPARP processing has not been carried out, all of the first electrode part PAE1, the second electrode part PAE2, and the first wire part CL1 may be supposed to be electrically connected.

Thus, driving current supplied by the first driving transistor DRT1 may be supplied to the first electrode part PAE1 and the second electrode part PAE2 through the first wire part CL1. Consequently, both the first area A1 in which the first electrode part PAE1 is disposed and the second area A2 in which the second electrode part PAE2 is disposed may generate light, and the first subpixel SP may be recognized as normally generating light.

When a cathode-anode short circuit is formed by an impurity present between the first electrode part PAE1 of the first anode AE1 and the cathode CE, neither the first area A1 in which the first electrode part PAE1 is disposed nor the second area A2 in which the second electrode part PAE2 is disposed can generate light. Consequently, the first subpixel SP may be recognized as a darkened point.

When the SPARP processing according to embodiments is carried out, the first bend BL1 of the first wire part CL1 may be in a disconnected state. That is, the first bend BL1 of the first wire part CL1 may be self-cut inside the first trench TRC1.

Thus, the first electrode part PAE1 among the first electrode part PAE1 and the second electrode part PAE2 is not electrically connected to the first driving transistor DRT1 through the first wire part CL1.

Consequently, driving current supplied by the first driving transistor DRT1 may only be supplied to the second electrode part PAE2 through the first wire part CL1. As a result, in the first area A1 in which the first electrode part PAE1 is disposed and the second area A2 in which the second electrode part PAE2 is disposed, the first area A1 does not generate light, and only the second area A2 can generate light. As described above, when the second area A2, a portion of the entire emission area of the first subpixel SP, generates light, the first subpixel SP may be recognized as normally emitting light.

Figure 15:
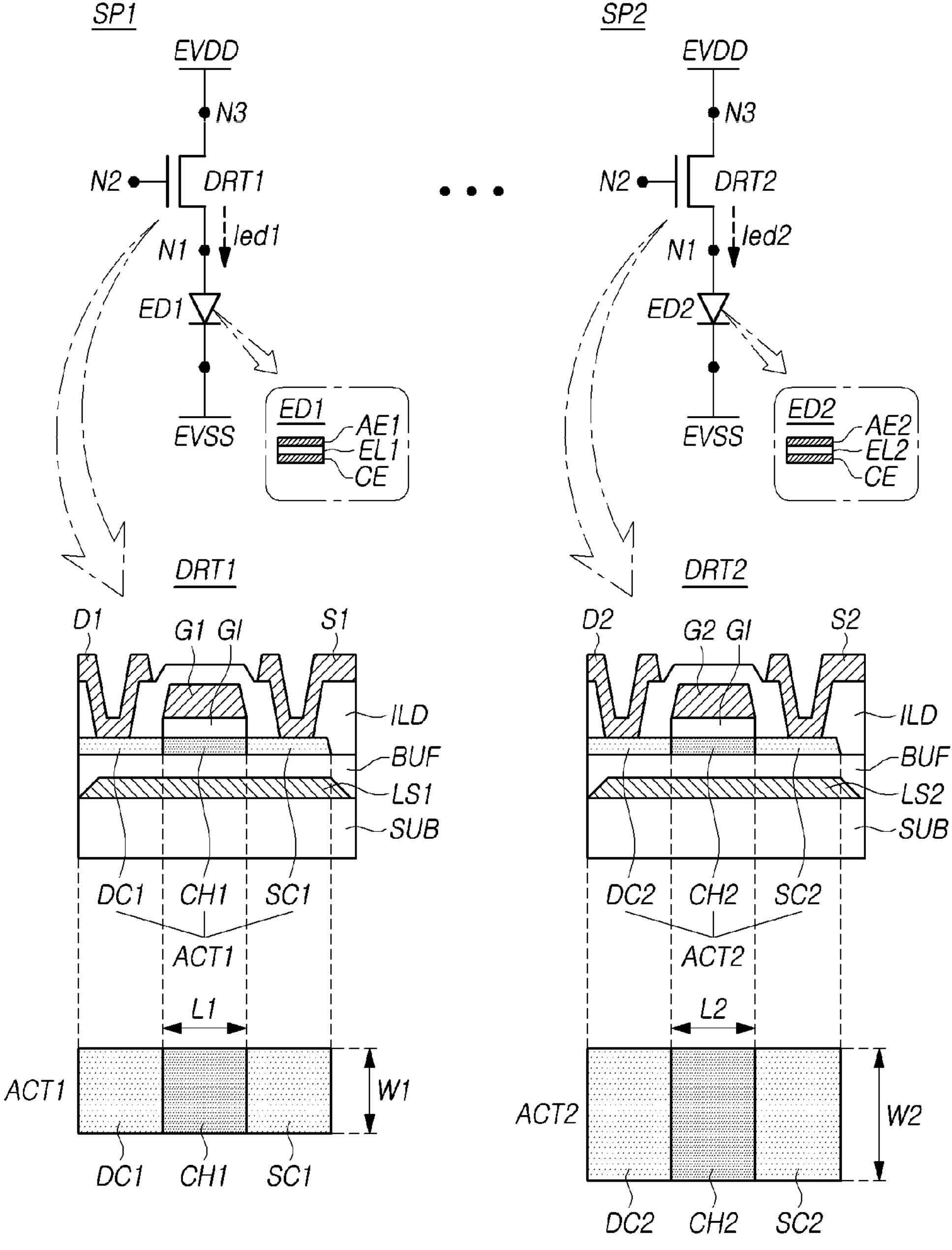
FIG. 15 illustrates an example of a first driving transistor in a first subpixel and an example of a second driving transistor in a second subpixel in the display device according to embodiments.
Figure 16:
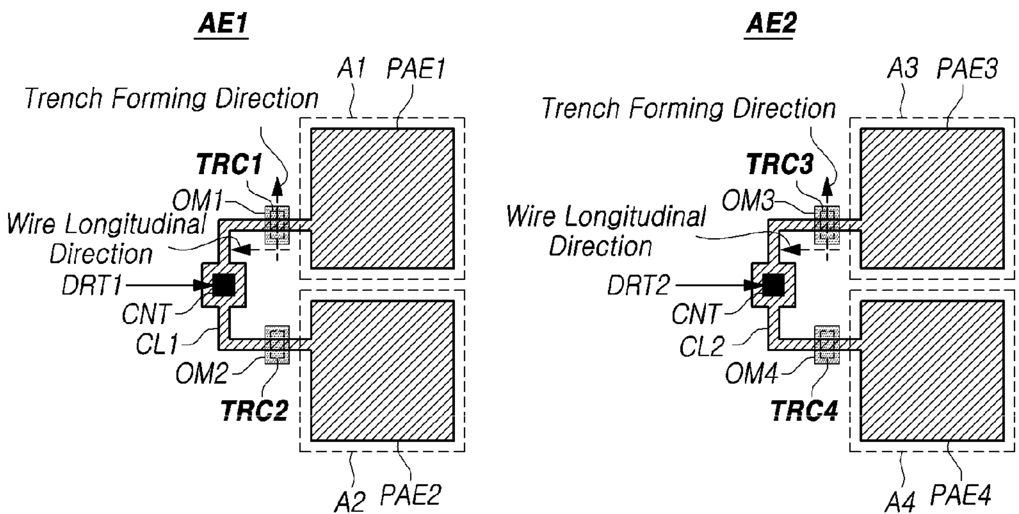
FIG. 16 illustrates an example of first anode in the first subpixel and an example of second anode in the second subpixel in the display device according to embodiments.

FIG. 15 illustrates an example of a first driving transistor DRT1 in a first subpixel SP1 and an example of a second driving transistor DRT2 in a second subpixel SP2 in the display device 100 according to embodiments, and FIG. 16 illustrates an example of first anode AE1 in the first subpixel SP1 and an example of second anode AE2 in the second subpixel SP2 in the display device 100 according to embodiments.

Referring to FIG. 15, the plurality of subpixels SP disposed in the display panel 110 may include the first subpixel SP and the second subpixel SP2. Each of the first subpixel SP and the second subpixel SP2 may have the subpixel structure illustrated in FIG. 1 or the subpixel structure illustrated in FIG. 5. Briefly described, the first subpixel SP may include the first driving transistor DRT1 and the first emitting device ED1 disposed over the substrate SUB. The second subpixel SP2 may include the second driving transistor DRT2 and a second emitting device ED2 disposed over the substrate SUB.

The first emitting device ED1 may include the first anode AE1, the first emitting layer EL1, and the cathode CE. The second emitting device ED2 may include the second anode AE2, a second emitting layer EL2, and the cathode CE.

The first anode AE1 may be disposed over the first driving transistor DRT1, and be included in the first subpixel SP. The first emitting layer EL1 may be disposed on the first anode AE1.

The second anode AE2 may be disposed over the second driving transistor DRT2, and be included in the second subpixel SP2. The second emitting layer EL2 may be disposed on the second anode AE2. The cathode CE may be disposed on the first emitting layer EL1 and the second emitting layer EL2.

A buffer layer BUF may be disposed over the substrate SUB, and the first driving transistor DRT1 and the second driving transistor DRT2 may be disposed over the buffer layer BUF. A first light shield layer LS1 may be disposed below the first driving transistor DRT1, and a second light shield layer LS2 may be disposed below the second driving transistor DRT2.

The first driving transistor DRT1 may include a first active layer ACT1, a first source electrode S1, a first drain electrode D1, and a first gate electrode G1. The first active layer ACT1 may be disposed over the buffer layer BUF, and include a first channel area CH1, a first source conductorized area SC1, and a first drain conductorized area DC1. A gate insulating film G1 may be disposed on the first active layer ACT1, and the first gate electrode G1 may be disposed on the gate insulating film G1. An interlayer insulating film ILD may be disposed on the first active layer ACT1 and the first gate electrode G1. The first source electrode S1 and the first drain electrode D1 may be disposed on the interlayer insulating film ILD, and be electrically connected to the first source conductorized area SC1 and the first drain conductorized area DC1 through holes in the interlayer insulating film ILD, respectively.

The second driving transistor DRT2 may include a second active layer ACT2, a second source electrode S2, a second drain electrode D2, and a second gate electrode G2. The second active layer ACT2 may be disposed over the buffer layer BUF, and may include the second channel area CH2, the second source conductorized area SC2, and the second drain conductorized area DC2. The gate insulating film G1 may be disposed on the second active layer ACT2, and the second gate electrode G2 may be disposed on the gate insulating film G1. The interlayer insulating film ILD may be disposed on the second active layer ACT2 and the second gate electrode G2. The second source electrode S2 and the second drain electrode D2 may be disposed on the interlayer insulating film ILD, and be electrically connected to the second source conductorized area SC2 and the second drain conductorized area DC2 through contact holes in the interlayer insulating film ILD.

The channel size of the first driving transistor DRT1 may be a value W1/L1 obtained by dividing the width W1 of the first channel area CH1 with the length L1 of the first channel area CH1. The channel size of the second driving transistor DRT2 may be a value W2/L2 obtained by dividing the width W2 of the second channel area CH2 with the length L2 of the second channel area CH2.

For example, the channel size W1/L1 of the first driving transistor DRT1 may be the same as the channel size W2/L2 of the second driving transistor DRT2. For another example, the channel size W1/L1 of the first driving transistor DRT1 may be different from the channel size W2/L2 of the second driving transistor DRT2.

Referring to FIG. 16, the first anode AE1 may include the first electrode part PAE1 disposed in the first area A1 of the first subpixel SP1, the second electrode part PAE2 disposed in the second area A2 different from the first area A1 of the first subpixel SP1, and the first wire part CL1 connecting the first electrode part PAE1 and the second electrode part PAE2.

The first wire part CL1 may be electrically connected to the first node N1 of the first driving transistor DRT1 through the contact hole CNT.

The overcoat layer OC may include the first trench TRC1 in an area overlapping the first wire part CL1. The overcoat layer OC may further include the second trench TRC2 in an area overlapping the first wire part CL1. The first organic material OM1 may be disposed inside and around the first trench TRC1. The second organic material OM2 may be disposed inside and around the second trench TRC2.

The second anode AE2 may include a third electrode part PAE3 disposed in a third area A3 of the second subpixel SP2, a fourth electrode part PAE4 disposed in a fourth area A4 different from the third area A3 of the second subpixel SP2, and a second wire part CL2 connecting the third electrode part PAE3 and the fourth electrode part PAE4.

The second wire part CL2 may be electrically connected to the first node N1 of the second driving transistor DRT2 through a contact hole CNT.

The overcoat layer OC may include a third trench TRC3 in an area overlapping the second wire part CL2. The overcoat layer OC may further include a fourth trench TRC4 in an area overlapping the second wire part CL2. The third organic material OM3 may be disposed inside and around the third trench TRC3. The fourth organic material OM4 may be disposed inside and around the fourth trench TRC4.

In the area of the first subpixel SP1, the overcoat layer OC may include the first trench TRC1 and the second trench TRC2. In the area of the second subpixel SP2, the overcoat layer OC may include the third trench TRC3 and the fourth trench TRC4.

When the channel size W1/L1 of the first driving transistor DRT1 of the first subpixel SP1 is the same as or similar to the channel size W2/L2 of the second driving transistor DRT2 of the second subpixel SP2, current driving ability of the first driving transistor DRT1 may be the same as or similar to current driving ability of the second driving transistor DRT2. In this case, the trench structure and the anode structure in the area of the first subpixel SP1 may be the same as or similar to the trench structure and the anode structure in the area of the second subpixel SP2.

When the channel size W1/L1 of the first driving transistor DRT1 of the first subpixel SP1 is different from the channel size W2/L2 of the second driving transistor DRT2 of the second subpixel SP2, current driving ability of the first driving transistor DRT1 may be different from current driving ability of the second driving transistor DRT2. In this case, the trench structure and the anode structure in the area of the first subpixel SP1 may be different from the trench structure and the anode structure in the area of the second subpixel SP2.

Hereinafter, for example, in a situation in which the channel size W1/L1 of the first driving transistor DRT1 of the first subpixel SP1 is smaller than the channel size W2/L2 of the second driving transistor DRT2 of the second subpixel SP2, the trench structure and the anode structure in the area of the first subpixel SP1 and the trench structure and the anode structure in the area of the second subpixel SP2 will be described.

The first trench TRC1 and the second trench TRC2 may have the same structure, and the third trench TRC3 and the fourth trench TRC4 may have the same structure. Thus, the trench structure and the anode structure of the overcoat layer OC in the area of the first subpixel SP1 will be described using the first trench TRC1, and the trench structure and the anode structure of the overcoat layer OC in the area of the second subpixel SP2 will be described using the third trench TRC3.

Referring to FIGS. 15 and 16, in a situation in which the first subpixel SP1 is a subpixel to which the SPARP processing has been carried out and the second subpixel SP2 is a subpixel to which the SPARP processing has not been carried out, the first wire part CL1 may be disconnected inside the first trench TRC1 of the overcoat layer OC, and the second wire part CL2 may not be disconnected inside the third trench TRC3 of the overcoat layer OC.

Figure 17:
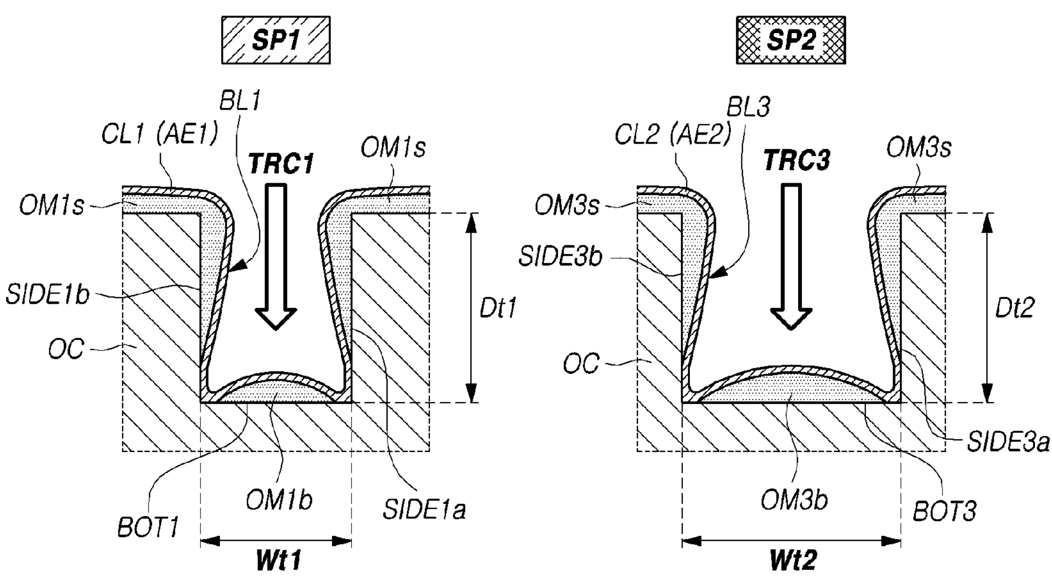
FIGS. 17 to 19 illustrate an example of a trench structure in the first subpixel and an example of a trench structure in the second subpixel in the display device according to embodiments.
Figure 18:
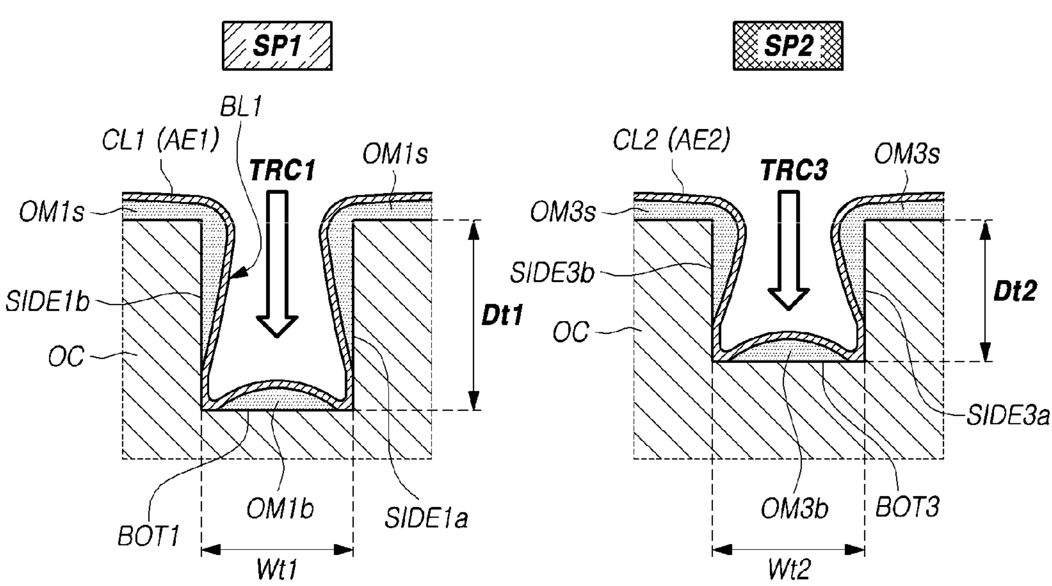
Figure 19:
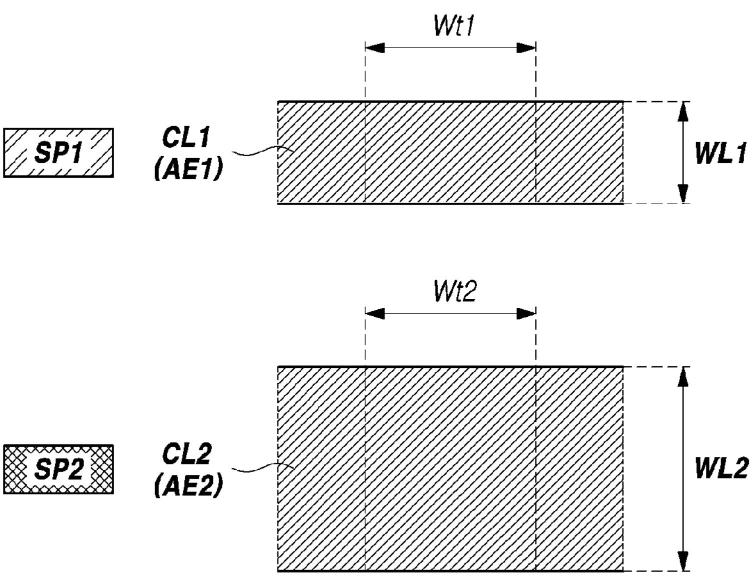

FIGS. 17 to 19 illustrate an example of a trench structure in the first subpixel SP1 and an example of a trench structure in the second subpixel SP2 in the display device 100 according to embodiments.

Referring to FIGS. 17 and 18, the first wire part CL1 of first anode AE1 may be disposed over the overcoat layer OC, and may include the first bend BL1 bent along the first inner side surface SIDE1*a*, the bottom surface BOT1, and the second inner side surface SIDE1*b* of the first trench TRC1. The second wire part CL2 of the second anode AE2 may include a third bend BL3 disposed over the overcoat layer OC, and bent along the first inner side surface SIDE1*a*, the bottom surface BOT1, and the second inner side surface SIDE1*b* of the third trench TRC3.

Referring to FIGS. 17 to 19, the channel size W1/L1 of the first driving transistor DRT1 in the first subpixel SP1 may be smaller than the channel size W2/L2 of the second driving transistor DRT2 in the second subpixel SP2. Thus, the second driving transistor DRT2 may have greater current driving ability than the first driving transistor DRT1, and drive greater current to flow through the second anode AE2. In contrast, the first driving transistor DRT1 may have smaller current driving ability than the second driving transistor DRT2, and drive smaller current to flow through the first anode AE1.

Referring to FIG. 17, since the channel size W1/L1 of the first driving transistor DRT1 is smaller than the channel size W2/L2 of the second driving transistor DRT2, the width Wt1 of the first trench TRC1 may be narrower than the width Wt2 of the third trench TRC3.

Since the channel size W1/L1 of the first driving transistor DRT1 is relatively small, the amount of normal driving current that the first driving transistor DRT1 drives to flow may be relatively small. Thus, the width Wt1 of the first trench TRC1 may be designed to be relatively narrow so that the first trench TRC1 can be easily disconnected by small aging current caused by the reverse bias processing in the SHARP processing.

Referring to FIG. 18, since the channel size W1/L1 of the first driving transistor DRT1 is smaller than the channel size W2/L2 of the second driving transistor DRT2, the depth Dt1 of the first trench TRC1 may be deeper than the depth Dt2 of the third trench TRC3.

Since the channel size W1/L1 of the first driving transistor DRT1 is relatively small, the amount of normal driving current that the first driving transistor DRT1 drives to flow may be relatively small. Thus, the depth Dt1 of the first trench TRC1 may be designed to be relatively deep so that the first trench TRC1 can be easily disconnected by small aging current caused by the reverse bias processing in the SHARP processing.

Referring to FIG. 19, since the channel size W1/L1 of the first driving transistor DRT1 is smaller than the channel size W2/L2 of the second driving transistor DRT2, the width WL1 of the first wire part CL1 may be narrower than the width WL2 of the second wire part CL2.

Since the channel size W1/L1 of the first driving transistor DRT1 is relatively small, the amount of normal driving current that the first driving transistor DRT1 drives to flow may be relatively small. Thus, the width Wt1 of the first wire part CL1 may be designed to be relatively narrow so that the first wire part CL1 can be easily disconnected by small aging current caused by the reverse bias processing in the SHARP processing.

Figure 20:
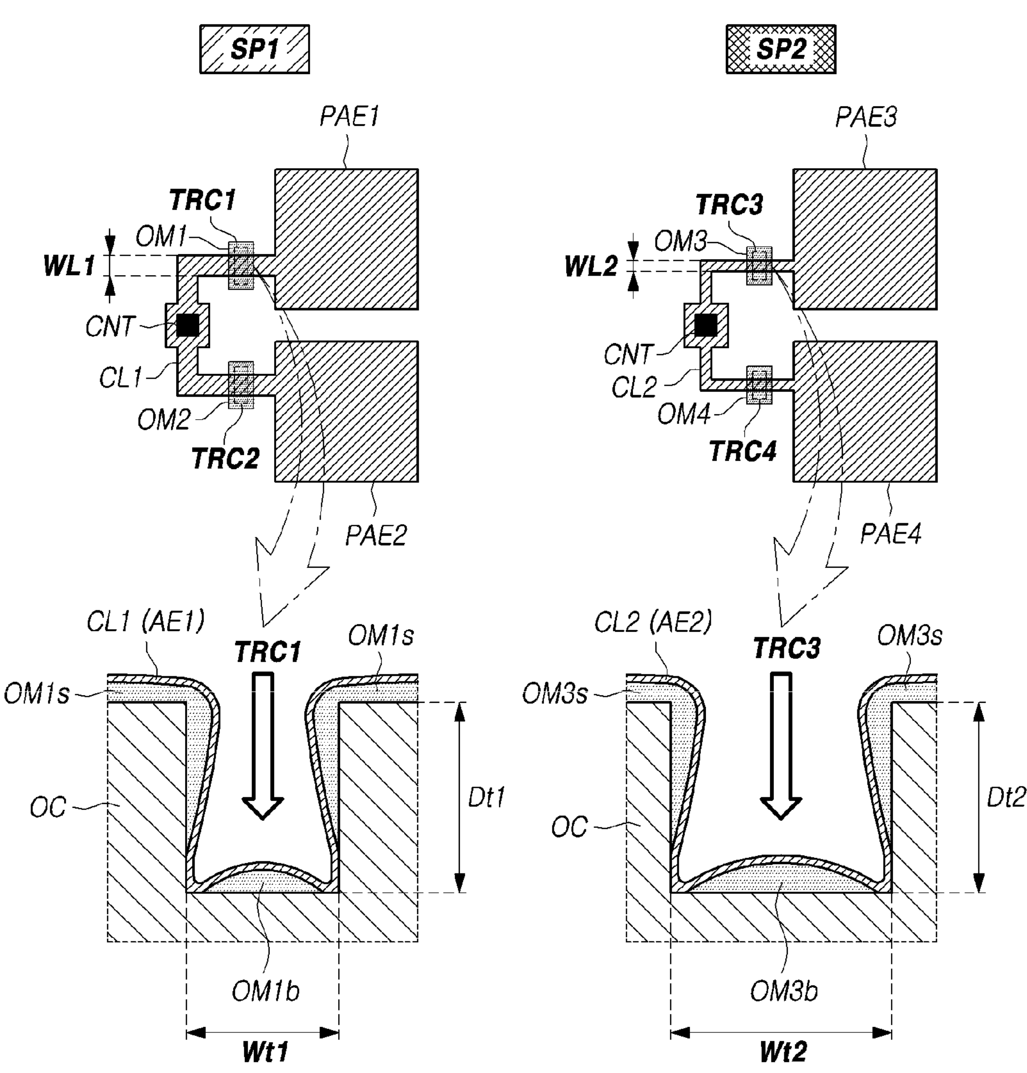
FIGS. 20 to 22 illustrates examples of the relationship between the connecting wire structure of the first subpixel and the connecting wire structure of the second subpixel and the relationship between the trench structure of the first subpixel and the trench structure of the second subpixel.
Figure 21:
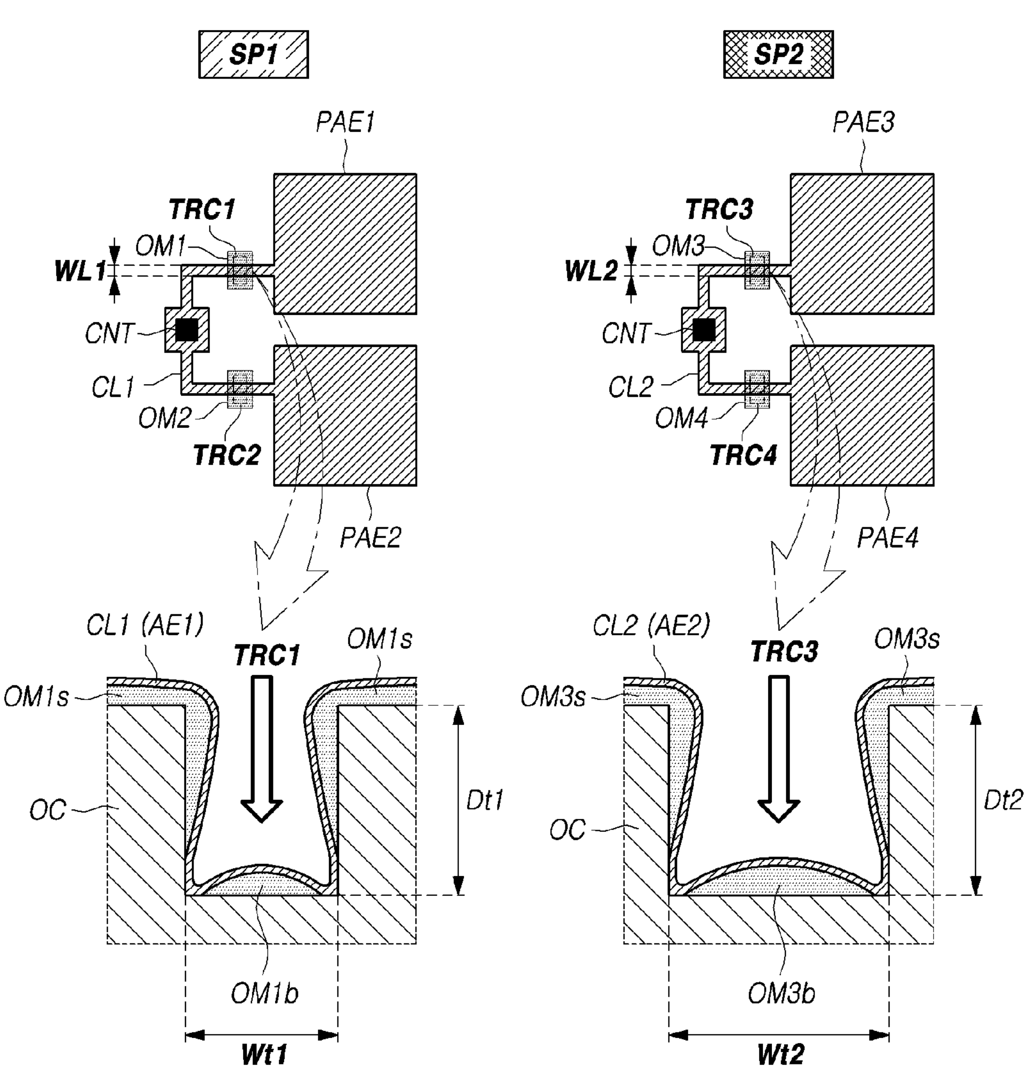
Figure 22:
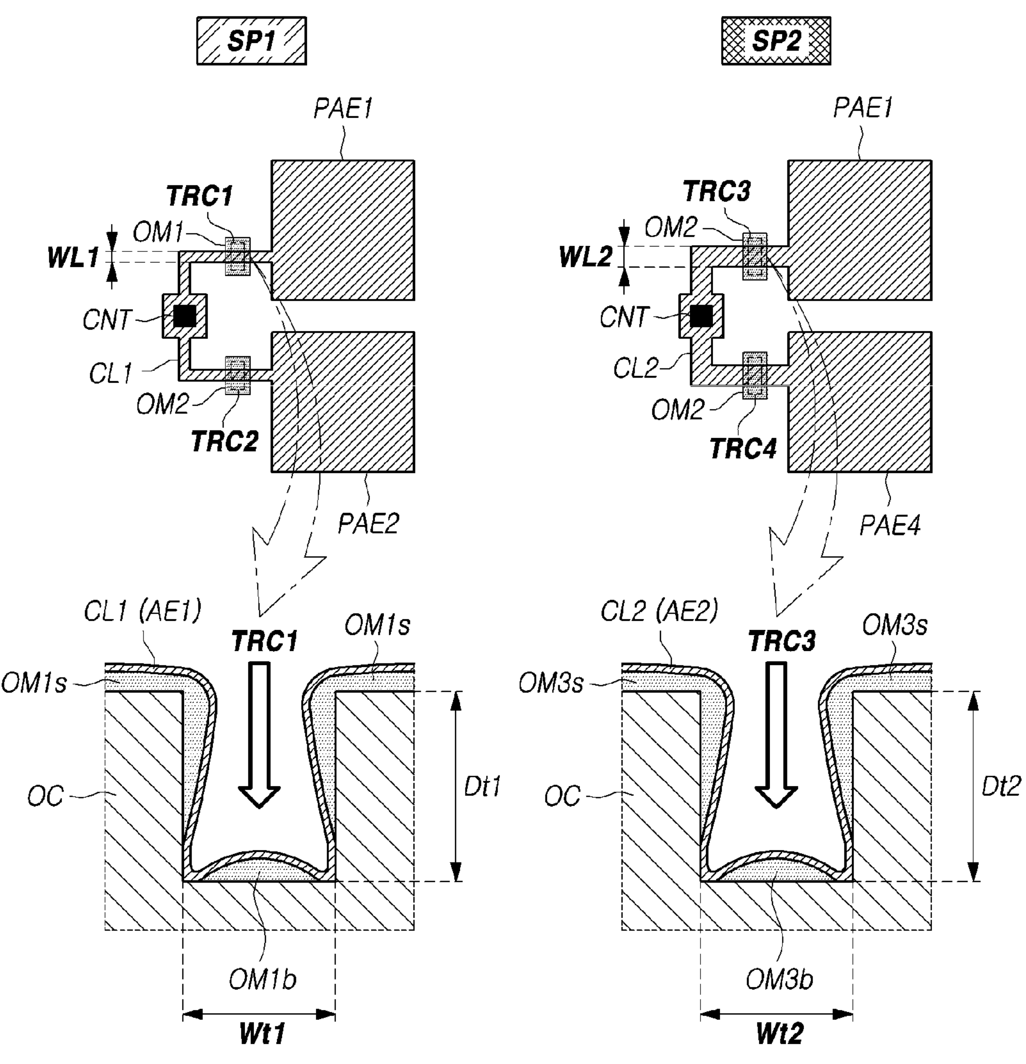

FIGS. 20 to 22 illustrates examples of the relationship between the connecting wire structure of the first subpixel SP1 and the connecting wire structure of the second subpixel SP2 and the relationship between the trench structure of the first subpixel SP1 and the trench structure of the second subpixel SP2.

Referring to FIG. 20, when the width Wt2 of the first trench TRC1 is narrower than the width Wt2 of the third trench TRC3 or the depth DO of the first trench TRC1 is deeper than the depth Dt2 of the third trench TRC3, the width WL1 of the first wire part CL1 of first anode AE1 may be wider than the width WL2 of the second wire part CL2 of the second anode AE2.

Referring to FIG. 20, when the width Wt2 of the third trench TRC3 is wider than the width Wt1 of the first trench TRC1 or the depth Dt2 of the third trench TRC3 is shallower than the depth Dt1 of the first trench TRC1, the width WL2 of the second wire part CL2 of the second anode AE2 may be narrower than the width WL1 of the first wire part CL1 of first anode AE1.

Regarding the structure of FIG. 20, the width Wt2 of the first trench TRC1 may be narrower than the width Wt2 of the third trench TRC3 or the depth DO of the first trench TRC1 is deeper than the depth Dt2 of the third trench TRC3. Thus, the amount of driving current flowing through the first wire part CL1 of first anode AE1 may be reduced. However, since the width WL1 of the first wire part CL1 of first anode AE1 is designed to the wider than the width WL2 of the second wire part CL2 of the second anode AE2, the amount of driving current flowing through the first wire part CL1 of first anode AE1 can be increased, thereby compensating for a decrease in the driving current.

Referring to FIG. 21, the channel size W1/L1 of the first driving transistor DRT1 may be different from the channel size W2/L2 of the second driving transistor DRT2. Even in this situation, the width WL1 of the first wire part CL1 may be the same as the width WL2 of the second wire part CL2.

However, the width Wt1 of the first trench TRC1 may be different from the width Wt2 of the third trench TRC3, or the depth DO of the first trench TRC1 may be different from the depth Dt2 of the third trench TRC3. For example, the width Wt1 of the first trench TRC1 may be narrow than the width Wt2 of the third trench TRC3, or the depth Dt1 of the first trench TRC1 may be deeper than the depth Dt2 of the third trench TRC3.

According to the structure of FIG. 21, even in the case that the width WL1 of the first wire part CL1 and the width WL2 of the second wire part CL2 are the same, the first wire part CL1 can be caused to be easily disconnected inside the first trench TRC1 by a small amount of aging current by setting the width Wt1 of the first trench TRC1 to be narrower than the width Wt2 of the third trench TRC3 or the depth Dt1 of the first trench TRC1 to be deeper than the depth Dt2 of the third trench TRC3.

Referring to FIG. 22, the channel size W1/L1 of the first driving transistor DRT1 may be different from the channel size W2/L2 of the second driving transistor DRT2. In this case, the width WL1 of the first wire part CL1 may be different from the width WL2 of the second wire part CL2. For example, the width WL1 of the first wire part CL1 may be narrower than the width WL2 of the second wire part CL2.

However, the width Wt1 of the first trench TRC1 may be the same as the width Wt2 of the third trench TRC3, or the depth DO of the first trench TRC1 may be the same as the depth Dt2 of the third trench TRC3.

According to the structure of FIG. 22, even in the case that the width Wt1 of the first trench TRC1 is the same as the width Wt2 of the third trench TRC3 or the depth DO of the first trench TRC1 is the same as the depth Dt2 of the third trench TRC3, the first wire part CL1 can be caused to be easily disconnected inside the first trench TRC1 by a small amount of aging current by designing the width WL1 of the first wire part CL1 to be narrower than the width WL2 of the second wire part CL2.

Figure 23:
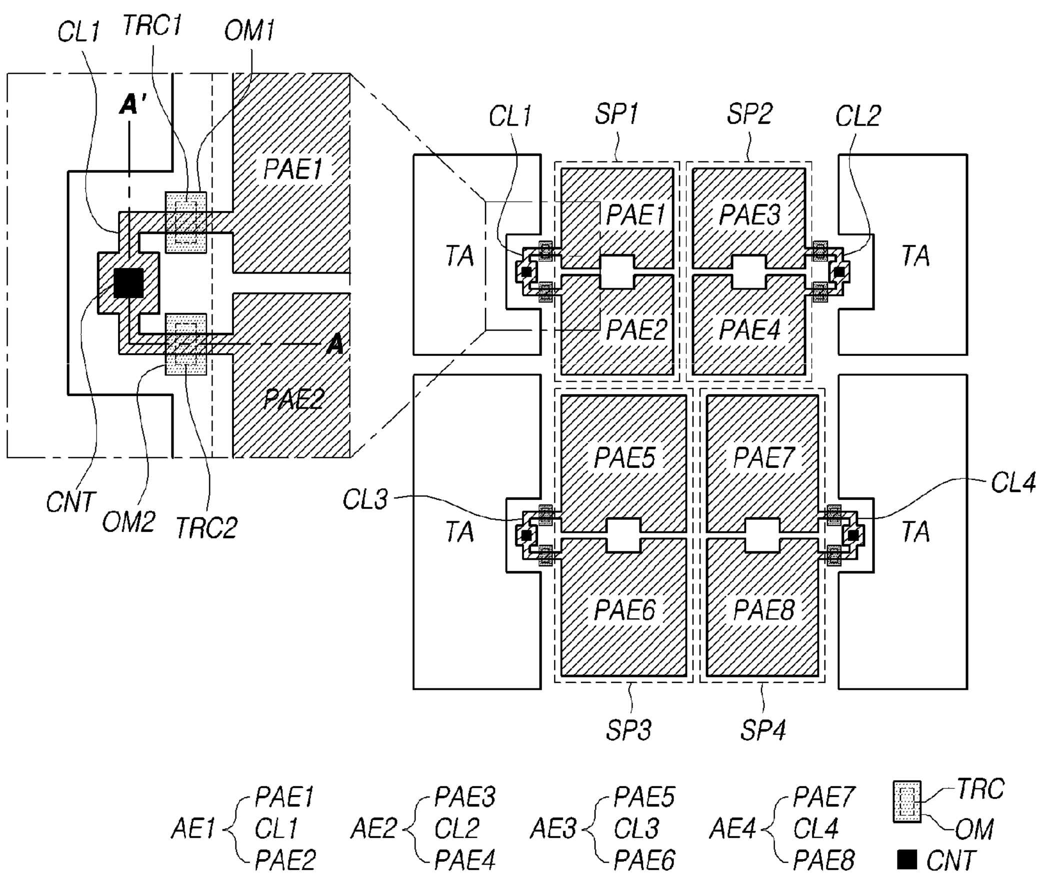
FIG. 23 is a plan diagram illustrating an area in which four subpixels are disposed when the display device according to embodiments is a transparent display.
Figure 24:
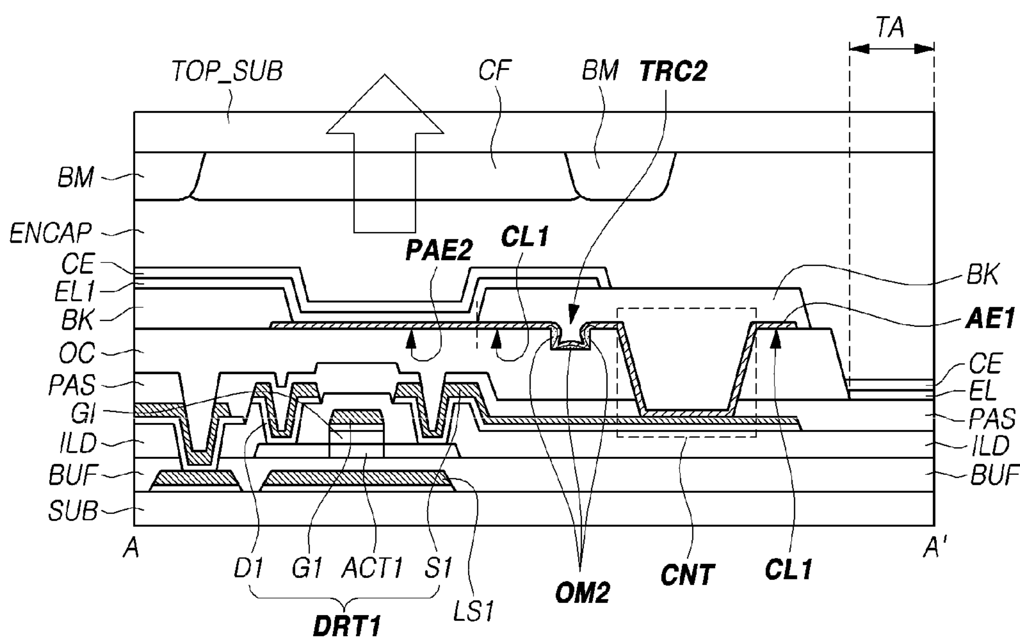
FIG. 24 is a cross-sectional diagram illustrating the A-A' area of FIG. 23.

FIG. 23 is a plan diagram illustrating an area in which four subpixels SP1, SP2, SP3, and SP4 are disposed when the display device 100 according to embodiments is a transparent display, and FIG. 24 is a cross-sectional diagram illustrating the A-A' area of FIG. 23 in which a self-cutting enabled structure (i.e., a trench structure) of a first anode AE1 in FIG. 23 is positioned.

Referring to FIG. 23, the display device 100 according to embodiments may be a transparent display. The display device 100 according to embodiments may include transmission areas TA and non-transmission areas. The non-transmission areas may be areas in which the subpixels SP1, SP2, SP3, and SP4 are disposed, emission areas of the subpixels SP1, SP2, SP3, and SP4, or areas in which pixel driver circuits SPC of the subpixels SP1, SP2, SP3, and SP4 are disposed. The transmittance of the transmission areas may be equal to or higher than a predetermined or selected threshold transmittance.

Referring to FIG. 23, for example, the four subpixels SP1, SP2, SP3, and SP4 may be disposed in two columns, and the transmission areas TA may be disposed on both sides of the four subpixels SP1, SP2, SP3, and SP4.

Referring to FIG. 23, the anode electrode AE of each of the four subpixels SP1, SP2, SP3, and SP4 may have the same self-cutting enabled structure as described above.

The first anode AE1 of the first subpixel SP1 may include the first electrode part PAE1, the second electrode part PAE2, and the first wire part CL1. The second anode AE2 of the second subpixel SP2 may include the third electrode part PAE3, the fourth electrode part PAE4, and the second wire part CL2. A third anode AE3 of the third subpixel SP3 may include a fifth electrode part PAE5, a sixth electrode part PAE6, and a third wire part CL3. A fourth anode AE4 of the fourth subpixel SP4 may include a seventh electrode part PAE7, an eighth electrode part PAE8, and a fourth wire part CL4.

A transmission area TA may be positioned on one side of the first subpixel SP1, and the first wire part CL1 may be disposed to intrude into a portion of the transmission area TA. The first wire part CL1 may extend across at least one trench TRC of the overcoat layer OC. An organic material OM may be disposed inside or around the at least one trench TRC, and the first wire part CL1 may be disposed on the organic material OM. The first wire part CL1 may be connected to the driving transistor DRT of the first subpixel SP1 through a contact hole CNT.

A transmission area TA may be positioned on one side of the second subpixel SP2, and the second wire part CL2 may be disposed to intrude into a portion of the transmission area TA. The second wire part CL2 may extend across at least one trench TRC of the overcoat layer OC. An organic material OM may be disposed inside or around the at least one trench TRC, and the second wire part CL2 may be disposed on the organic material OM. The second wire part CL2 may be connected to the driving transistor DRT of the second subpixel SP2 through a contact hole CNT.

A transmission area TA may be positioned on one side of the third subpixel SP3, and the third wire part CL3 may be disposed to intrude into a portion of the transmission area TA. The third wire part CL3 may extend across at least one trench TRC of the overcoat layer OC. An organic material OM may be disposed inside or around the at least one trench TRC, and the third wire part CL3 may be disposed on the organic material OM. The third wire part CL3 may be connected to the driving transistor DRT of the third subpixel SP3 through a contact hole CNT.

A transmission area TA may be positioned on one side of the fourth subpixel SP4, and the fourth wire part CL4 may be disposed to intrude into a portion of the transmission area TA. The fourth wire part CL4 may extend across at least one trench TRC of the overcoat layer OC. An organic material OM may be disposed inside or around the at least one trench TRC, and the fourth wire part CL4 may be disposed on the organic material OM. The fourth wire part CL4 may be connected to the driving transistor DRT of the fourth subpixel SP4 through a contact hole CNT.

Referring to FIG. 24, the A-A' area nay be a portion of the area in which the first wire part CL1 of first anode AE1, included in the first subpixel SP1, is disposed. The A-A' area may be an area in which the self-cutting enabled structure (i.e., the trench structure) of the first anode AE1 is positioned.

Referring to FIG. 24, a passivation film PAS may be disposed to cover the first drain electrode D1 and the first source electrode S1 of the first driving transistor DRT1 in the first subpixel SP1. The cross-sectional structure including from the substrate SUB to the first driving transistor DRT1 is the same as that described above with reference to FIG. 15.

Referring to FIGS. 23 to 24, the overcoat layer OC may be disposed over the passivation film PAS. The overcoat layer OC may include a first trench TRC1 formed at a position corresponding to the first cutting point CP1 and a second trench TRC2 formed at a position corresponding to the second cutting point CP2. The second organic material OM2 may be disposed inside and outside the second trench TRC2.

The first anode AE1 may include the first electrode part PAE1, the second electrode part PAE2, and the first wire part CL1. The first wire part CL1 of first anode AE1 may include a first connecting portion connected to the first electrode part PAE1, a second connecting portion connected to the second electrode part PAE2, and a link portion between the first connecting portion and the second connecting portion. The link portion of the first wire part CL1 may pass across the first trench TRC1 and the second trench TRC2.

The portion of the link portion of the first wire part CL1 passing across the second trench TRC2 may be disposed along the inner side surfaces and the bottom surface of the second trench TRC2. In addition, the portion of the link portion of the first wire part CL1 passing across the second trench TRC2 may be disposed on the second organic material OM2 disposed inside and outside the trench TRC2.

The link portion of the first wire part CL1 may be electrically connected to the first node N1 corresponding to the first source electrode S1 of the first driving transistor DRT1 through the contact hole CNT in the overcoat layer OC.

A bank BK may be disposed on the first anode AE1 The bank BK may have open areas corresponding to the emission areas of the first subpixel SP1. Here, the emission areas of the first subpixel SP1 may match the position of the first electrode part PAE1 and the position of the second electrode part PAE2. The positions of the open areas in the bank BK may match the positions of the first electrode part PAE1 and the second electrode part PAE2 of the first anode AE1.

The first emitting layer EL1 may be disposed on the bank BK. In each of the open areas of the bank BK, the first emitting layer EL1 may be disposed on the first electrode part PAE1 and the second electrode part PAE2. The cathode CE may be disposed on the first emitting layer EL1, an encapsulation layer ENCAP may be disposed over the cathode CE, a black matrix BM and a color filter CF may be disposed on portions of the encapsulation layer ENCAP, and a top substrate TOP_SUB may be disposed over the black matrix BM, the color filter CF, and the remaining portion of the encapsulation layer ENCAP not covered with the black matrix BM or the color filter CF.

The insulating layers BUF, ILD, and PAS may be disposed in the transmission area TA, and no metal layers may be disposed in the transmission area TA. Here, since the cathode CE is a transparent cathode formed of a transparent conductive film, the cathode CE may be disposed in the transmission area TA. An emitting layer EL may be disposed in the transmission area TA.

The above description has been presented to enable any person skilled in the art to make and use the technical idea of the present disclosure, and has been provided in the context of a particular application and its benefits. Various modifications, additions and substitutions to the described embodiments will be readily apparent to those skilled in the art, and the general principles described herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:

a substrate;

a first driving transistor disposed over the substrate and included in a first subpixel;

an overcoat layer positioned over the first driving transistor;

a first anode disposed over the first driving transistor and included in the first subpixel;

a first emitting layer on the first anode;

a cathode on the first emitting layer; and a black matrix on the cathode, wherein the first anode includes a first electrode part disposed in a first area of the first subpixel, a second electrode part disposed in a second area of the first subpixel different from the first area, and a first wire part connecting the first electrode part and the second electrode part, wherein the overcoat layer includes a first trench in an area overlapping the first wire part, and the first wire part includes a first bend disposed over the overcoat layer and bent along a first inner side surface, a bottom surface, and a second inner side surface of the first trench, wherein the first wire part is electrically connected to a first node of the first driving transistor through a contact hole in the overcoat layer, wherein a depth of the first trench is smaller than a depth of the contact hole and the first trench does not extend through the overcoat layer, and wherein the first trench overlaps the black matrix and is located in a non-emission area.

2. The display device of claim 1, wherein the overcoat layer further includes a second trench in the area overlapping the first wire part, and the first wire part further includes a second bend disposed over the overcoat layer and bent along a first inner side surface, a bottom surface, and a second inner side surface of the second trench, and wherein the first trench is positioned between the contact hole and the first electrode part, and the second trench is positioned between the contact hole and the second electrode part.

3. The display device of claim 1, wherein the first trench extends in a direction transverse a longitudinal direction of the first wire part.

4. The display device of claim 1, further comprising a first side organic material positioned on the first inner side surface and the second inner side surface of the first trench, wherein the first side organic material extends to an outer portion of the first trench.

5. The display device of claim 4, further comprising a first bottom organic material positioned on the bottom surface of the first trench.

6. The display device of claim 5, wherein the first side organic material and the first bottom organic material are separated from each other.

7. The display device of claim 1, wherein the angle between the first inner side surface or the second inner side surface of the first trench and the bottom surface of the first trench is equal to or smaller than 90°.

8. The display device of claim 1, wherein the second electrode part is connected to the first driving transistor, and the first electrode part is not connected to the first driving transistor.

9. The display device of claim 1, wherein the first bend of the first wire part is disconnected.

10. The display device of claim 1, wherein the first area in which the first electrode part is disposed does not emit light, and the second area in which the second electrode part is disposed emits light.

11. The display device of claim 1, further comprising:

a second driving transistor disposed over the substrate and included in a second subpixel;

a second anode disposed over the second driving transistor and included in the second subpixel; and a second emitting layer on the second anode, wherein the second anode includes a third electrode part disposed in a third area of the second subpixel, a fourth electrode part disposed in a fourth area of the second subpixel different from the third area, and a second wire part connecting the third electrode part and the fourth electrode part, and wherein the overcoat layer includes a third trench in an area overlapping the second wire part, and the second wire part includes a third bend disposed over the overcoat layer and bent along a first inner side surface, a bottom surface, and a second inner side surface of the third trench.

12. The display device of claim 11, wherein the channel size of the first driving transistor is smaller than the channel size of the second driving transistor, and the width of the first trench is narrower than the width of the third trench.

13. The display device of claim 11, wherein the channel size of the first driving transistor is smaller than the channel size of the second driving transistor, and the depth of the first trench is deeper than the depth of the third trench.

14. The display device of claim 11, wherein the channel size of the first driving transistor is smaller than the channel size of the second driving transistor, and the width of the first wire part is narrower than the width of the second wire part.

15. The display device of claim 11, wherein, when the width of the first trench is narrower than the width of the third trench or the depth of the first trench is deeper than the depth of the third trench, the width of the first wire part is wider than the width of the second wire part.

16. The display device of claim 11, wherein the width of the first wire part is the same as the width of the second wire part, and the width of the first trench is different from the width of the third trench or the depth of the first trench is different from the depth of the third trench.

17. The display device of claim 11, wherein the width of the first wire part is different from the width of the second wire part, and the width of the first trench is the same as the width of the third trench or the depth of the first trench is the same as the depth of the third trench.

18. The display device of claim 1, wherein a transmission area is positioned on one side of the first subpixel, and the first wire part is disposed to intrude into a portion of the transmission area.

19. A display device comprising:

a first subpixel comprising a first driving transistor, a first anode, and a first emitting layer;

a second subpixel comprising a second driving transistor, a second anode, and a second emitting layer;

an overcoat layer positioned between the first and second driving transistors and the first and second anodes, and comprising a first trench positioned in an area of the first anode and a second trench positioned in an area of the second anode; and a black matrix on the overcoat layer, wherein the first anode includes a first electrode part disposed in a first area of the first subpixel, a second electrode part disposed in a second area of the first subpixel different from the first area, and a first wire part connecting the first electrode part and the second electrode part, wherein the second anode includes a third electrode part disposed in a third area of the second subpixel, a fourth electrode part disposed in a fourth area of the second subpixel different from the third area, and a second wire part connecting the third electrode part and the fourth electrode part, wherein the first wire part is disconnected inside the first trench of the overcoat layer, and the second wire part is not disconnected inside the second trench of the overcoat layer, wherein the first wire part is electrically connected to a first node of the first driving transistor through a contact hole in the overcoat layer, wherein a depth of the first trench and a depth of the second trench are smaller than a depth of the contact hole and the first trench does not extend through the overcoat layer, and wherein the first trench overlaps the black matrix and is located in a non-emission area.

* * * * *